US012681101B2

(12) United States Patent (10) Patent No.: US 12,681,101 B2
Ishikawa et al. (45) Date of Patent: Jul. 14, 2026

(54) DETECTION DEVICE, MANAGEMENT APPARATUS, AND DETECTION METHOD

(71) Applicant: KABUSHIKI KAISHA TOYOTA CHUO KENKYUSHO, Nagakute (JP)

(72) Inventors: Keisuke Ishikawa, Nagakute (JP); Masanori Ishigaki, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 145 days.

(21) Appl. No.: 18/288,106

(22) PCT Filed: Jun. 14, 2022

(86) PCT No.: PCT/JP2022/024998

§ 371 (c)(1),
(2) Date: Oct. 24, 2023

(87) PCT Pub. No.: WO2022/265121

PCT Pub. Date: Dec. 22, 2022

(65) Prior Publication Data

US 2024/0201274 A1 Jun. 20, 2024

(30) Foreign Application Priority Data

Jun. 17, 2021 (JP) ................................. 2021-100855

(51) Int. Cl.
*G01R 31/389* (2019.01)
*G01R 31/396* (2019.01)
(Continued)

(52) U.S. Cl.
CPC ......... *G01R 31/389* (2019.01); *G01R 31/396* (2019.01); *H01M 10/488* (2013.01); *H01M 10/0525* (2013.01)

(58) Field of Classification Search
CPC . G01R 31/389; G01R 31/396; H01M 10/488; H01M 10/0525
(Continued)

(56) References Cited

U.S. PATENT DOCUMENTS 12,040,632 B2 * 7/2024 Bhandarkar .......... H02J 50/402
2009/0218986 A1 9/2009 Jarvinen
(Continued)

FOREIGN PATENT DOCUMENTS

CN 102539005 A 7/2012
CN 102967831 A 3/2013
(Continued)

OTHER PUBLICATIONS

Jan. 23, 2024 Office Action issued in Japanese Patent Application No. 2022-011638.
(Continued)

*Primary Examiner* — Huy Q Phan
*Assistant Examiner* — Trung Q Nguyen
(74) *Attorney, Agent, or Firm* — Oliff PLC

(57) ABSTRACT

A detection device includes a detector and a controller. The detector has at least one resonator circuit applying at least one specific frequency vibration to a lithium-ion secondary battery, measures an attenuation characteristic of at least one resonant current, and outputs the attenuation characteristic as a detection signal. The controller detects lithium deposition and/or presence of foreign metal inside the lithium-ion secondary battery by using the detection signal of the attenuation characteristic acquired from the detector.

20 Claims, 17 Drawing Sheets

(51) Int. Cl.
*H01M 10/48* (2006.01)
*H01M 10/0525* (2010.01)

(58) Field of Classification Search
USPC ............. 324/500, 525, 600, 617–622, 76.11, 324/76.52, 757.05, 762.06
See application file for complete search history.

(56) References Cited

U.S. PATENT DOCUMENTS

| | | | | |
|---|---|---|---|---|
| 2016/0111758 A1* | 4/2016 | Stimm | .............. | H01M 10/0525 |
| | | | | 429/90 |
| 2018/0034113 A1* | 2/2018 | Gibbs | ............... | H01M 10/0525 |
| 2018/0056809 A1* | 3/2018 | Uchida | ................... | B60L 58/22 |
| 2018/0309327 A1* | 10/2018 | Miyamoto | .............. | H02J 50/70 |
| 2018/0340984 A1 | 11/2018 | Kanada et al. | | |
| 2019/0225099 A1* | 7/2019 | Sieber | ..................... | H02J 50/60 |
| 2020/0209319 A1 | 7/2020 | Mitsui et al. | | |
| 2020/0408844 A1 | 12/2020 | Ogasawara et al. | | |
| 2023/0231209 A1* | 7/2023 | Yamagami | ........... | G01R 31/389 |
| | | | | 320/134 |
| 2024/0044827 A1* | 2/2024 | Ishigaki | .................. | G01N 27/02 |
| 2024/0304878 A1* | 9/2024 | Wampler | ............ | H01M 10/488 |

FOREIGN PATENT DOCUMENTS

| | | | |
|---|---|---|---|
| CN | 103163377 A | 6/2013 | |
| CN | 104950176 A | 9/2015 | |
| CN | 108614220 A | 10/2018 | |
| EP | 4 060 599 A1 | 9/2022 | |
| JP | 2002207019 A | 7/2002 | |
| JP | 2005331520 A | 12/2005 | |
| JP | 2013-218909 A | 10/2013 | |
| JP | 2018-032558 A | 3/2018 | |
| JP | 2018-200800 A | 12/2018 | |
| JP | 6436271 B1 | 12/2018 | |
| JP | 2019-211232 A | 12/2019 | |
| JP | 2020-106315 A | 7/2020 | |
| JP | 2021-077570 A | 5/2021 | |
| JP | 2022108602 A | 7/2022 | |
| WO | 2020115761 A1 | 6/2020 | |
| WO | 2021/246788 A1 | 12/2021 | |

OTHER PUBLICATIONS

Mar. 27, 2025 Office Action issued in U.S. Appl. No. 18/266,891.
Sep. 30, 2025 Office Action issued in Japanese Patent Application No. 2022-011638.
Petzl et al.; "Lithium plating in a commercial lithium-ion battery—A low-temperature aging study;" Journal of Power Sources; 2015; pp. 799-807; vol. 275.
Gargh et al.; "Correlating capacity fade with film resistance loss in fast charging of lithium-ion battery;" Journal of Power Sources; 2021; 229360; 7 pages; vol. 485, No. 24.
Chen et al.; "Detection of lithium plating in lithium-ion batteries by distribution of relaxation times;" Journal of Power Sources; 2021; 229867; 9 pages; vol. 496, No. 8.
Feb. 15, 2022 Search Report issued in International Patent Application No. PCT/JP2021/048851.
Feb. 15, 2022 Written Opinion of the International Searching Authority issued in International Patent Application No. PCT/JP2021/048851.
Mar. 28, 2023 Search Report issued in International Patent Application No. PCT/JP2022/047162.
Mar. 28, 2023 Written Opinion of the International Searching Authority issued in International Patent Application No. PCT/JP2022/047162.
May 25, 2023 Search Report issued in International Patent Application No. PCT/JP2023/010576.
May 25, 2023 Written Opinion of the International Searching Authority issued in International Patent Application No. PCT/JP2023/010576.
Oct. 6, 2022 Search Report issued in International Patent Application No. PCT/JP2022/024998.
Oct. 6, 2022 Written Opinion of the International Searching Authority issued in International Patent Application No. PCT/JP2022/024998.
Feb. 24, 2026 Office Action issued in Japanese Patent Application No. 2022-153515.
Apr. 21, 2026 Office Action issued in Japanese Patent Application No. 2022-053760.
Apr. 23, 2026 Office Action issued in Chinese Patent Application No. 202280032417.9.

* cited by examiner

[Fig. 1]
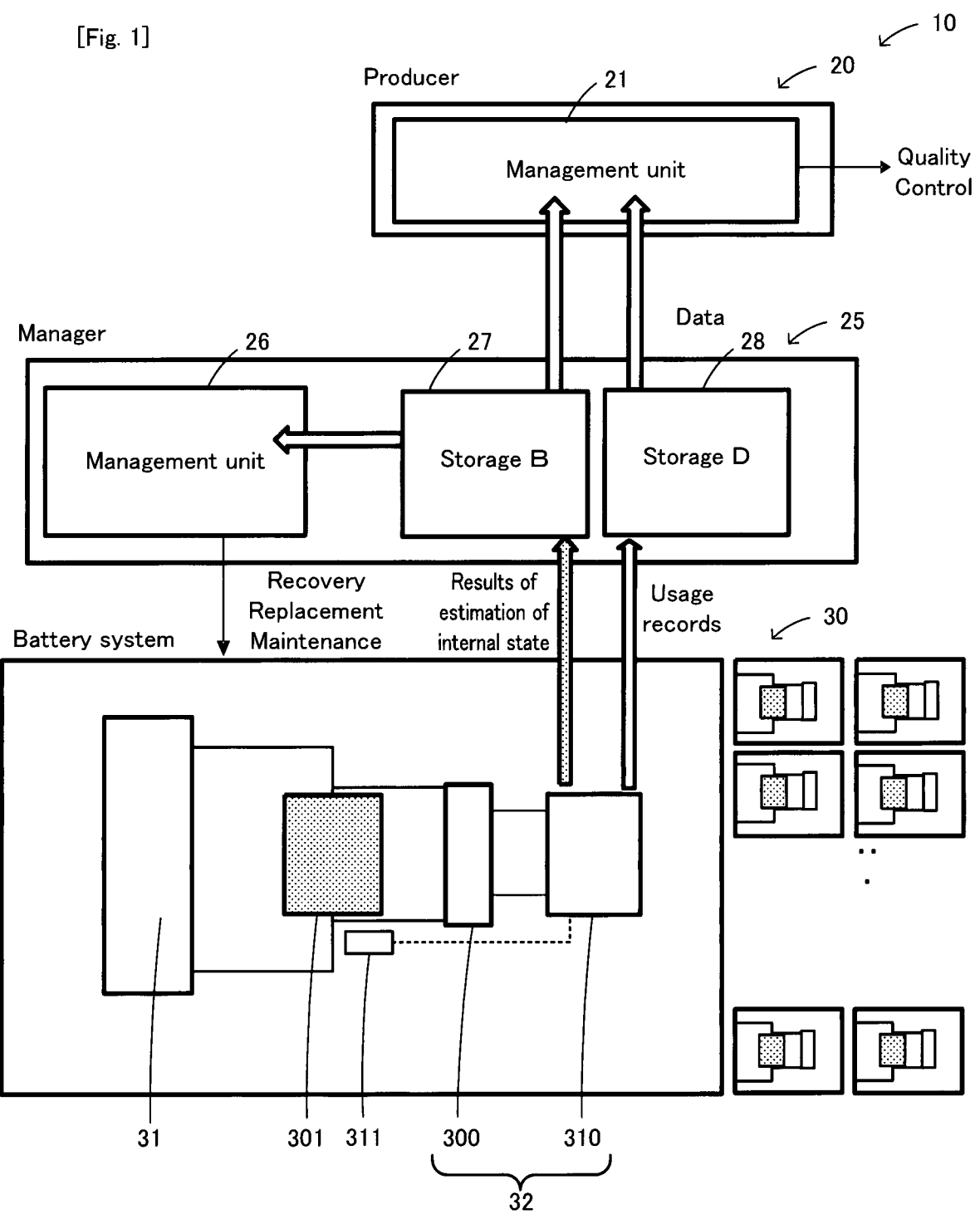

[Fig. 2]
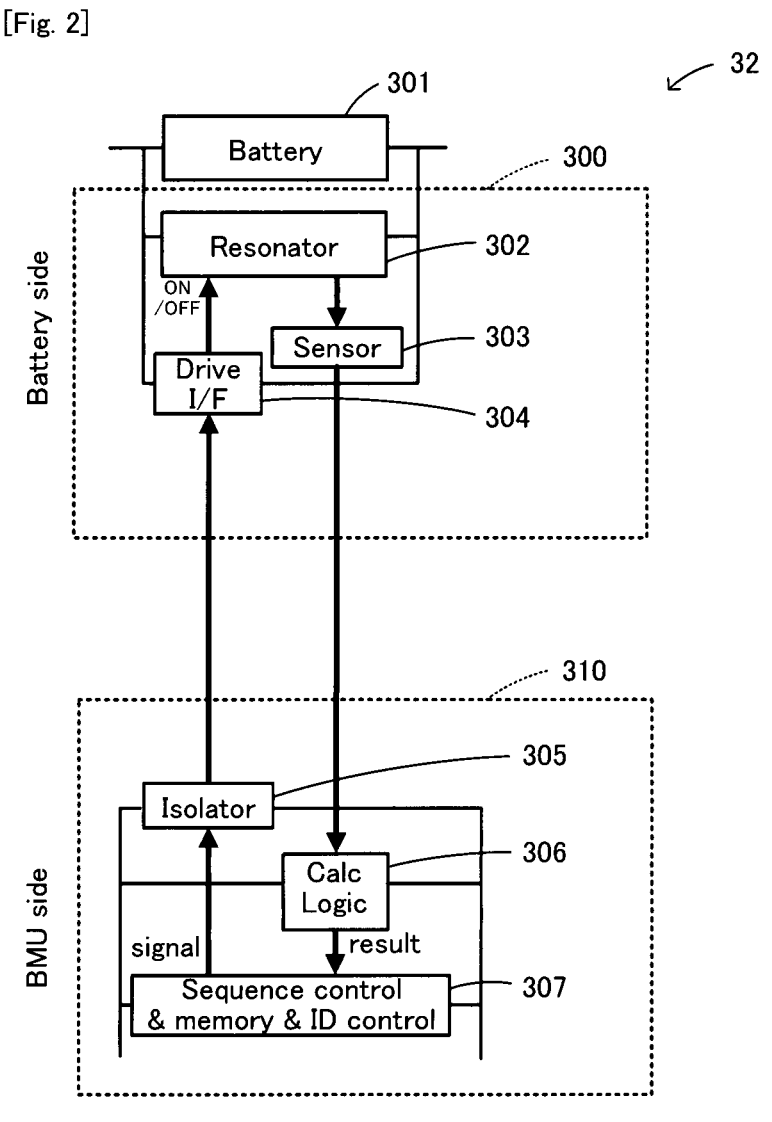

[Fig.3]
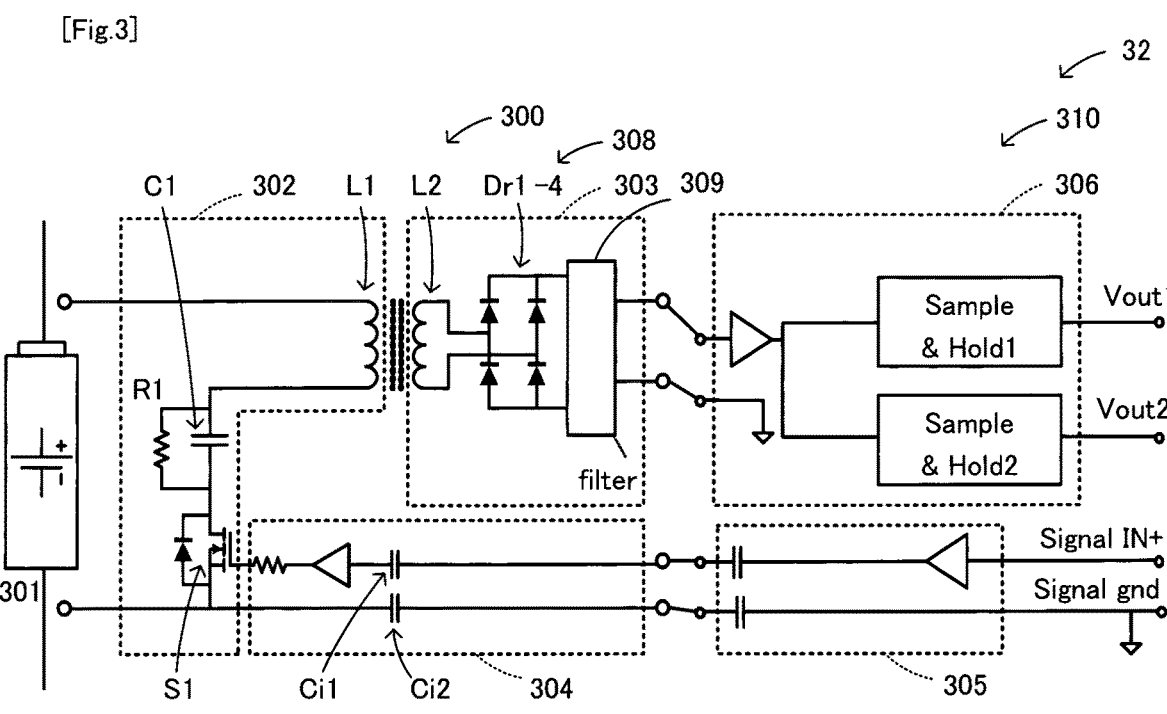
[Fig. 4]
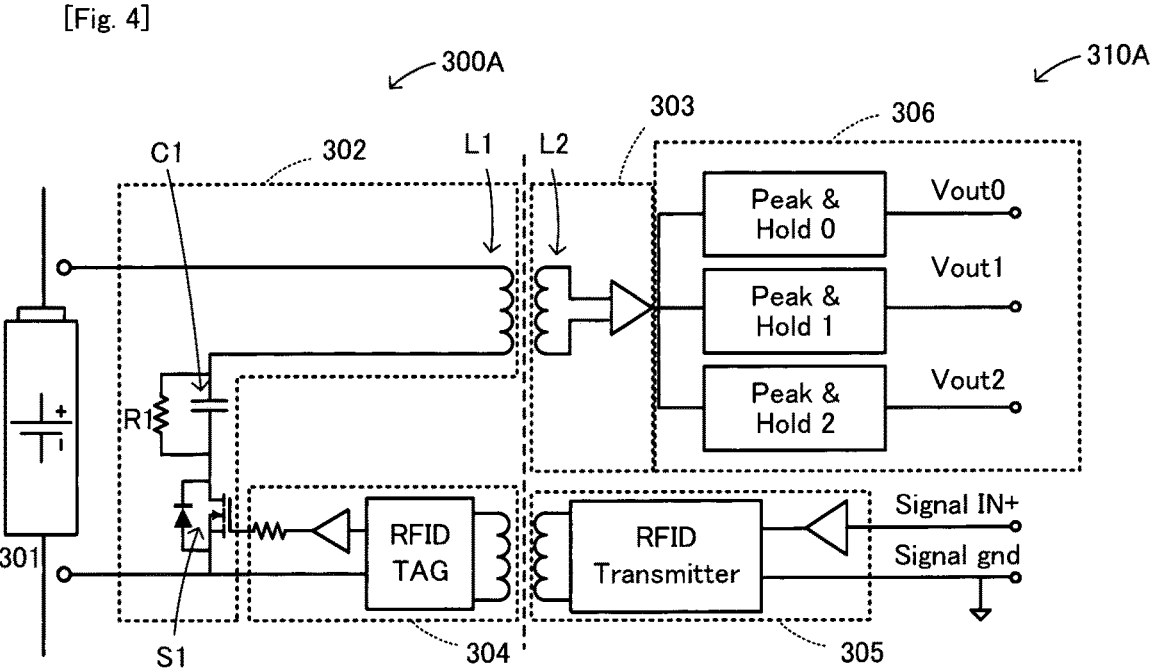

[Fig. 5]
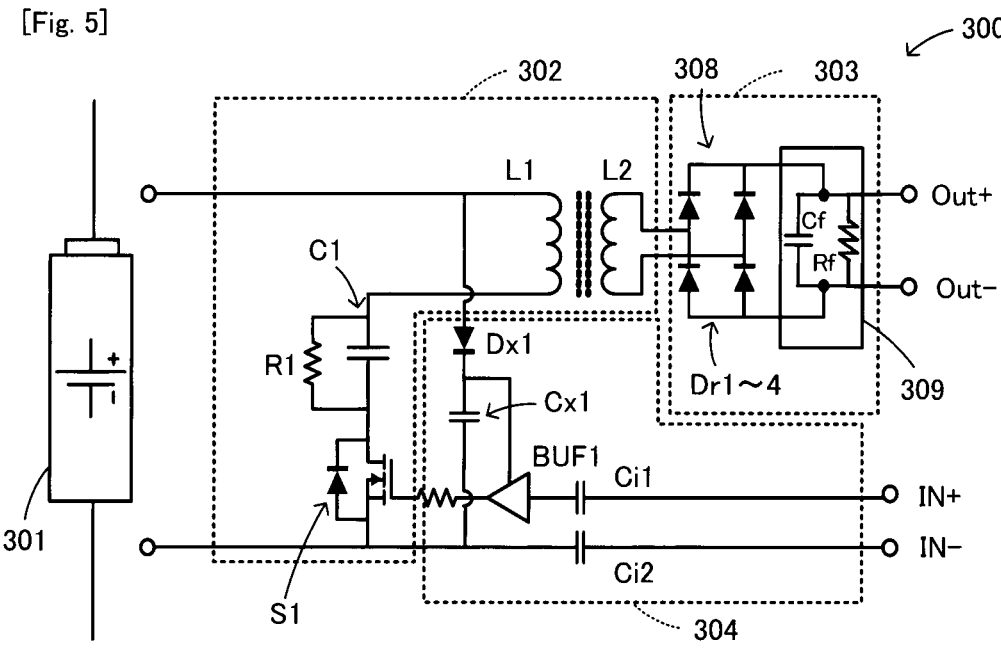
[Fig. 6]
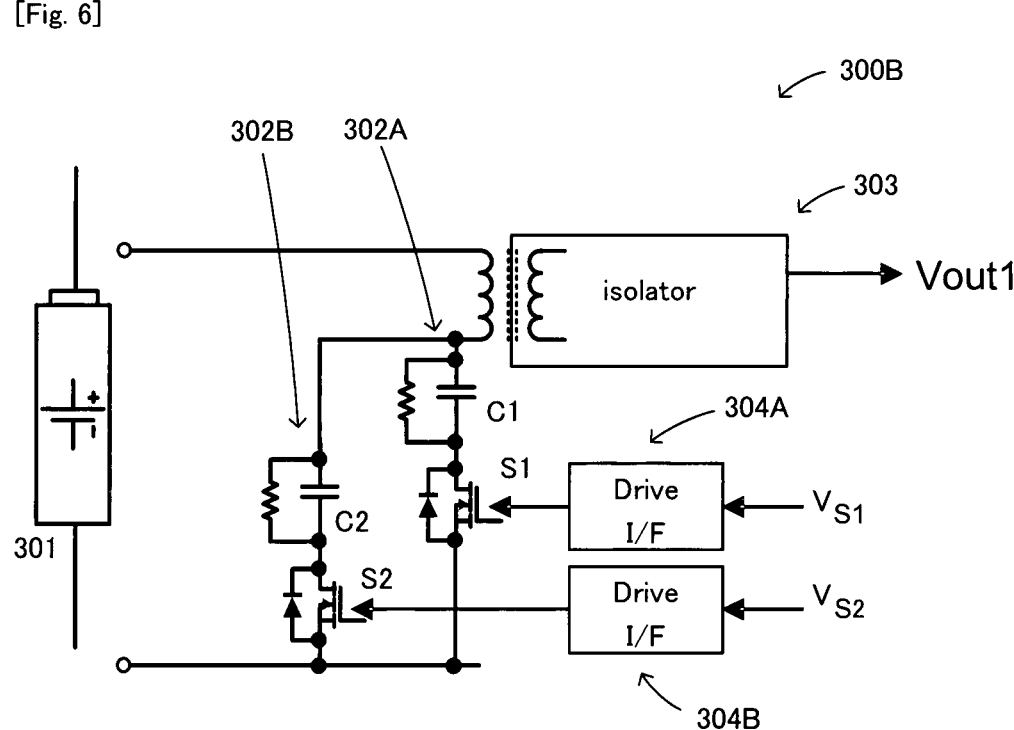

[Fig. 7]
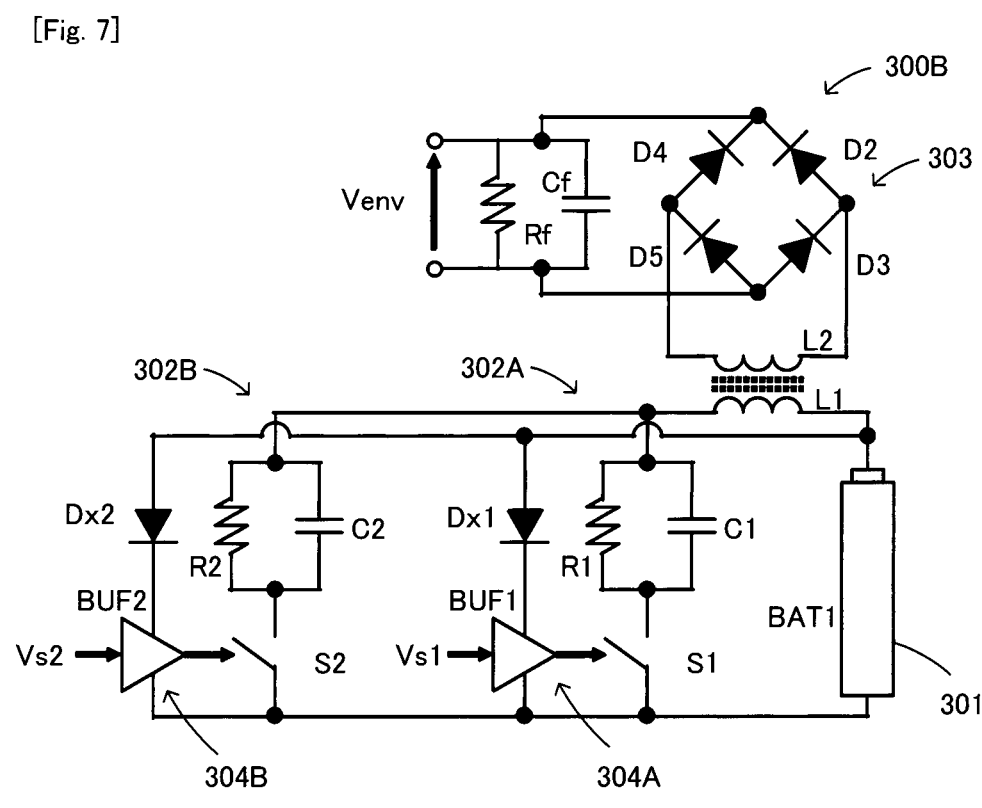
[Fig. 8]
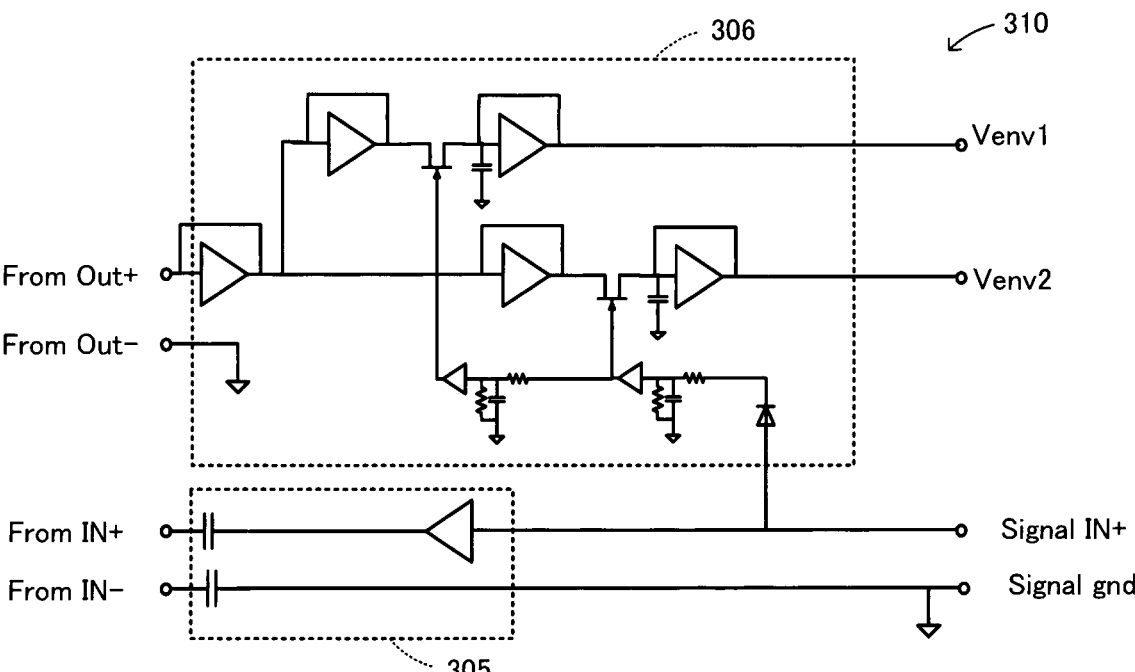

[Fig. 9]

[Fig. 10A]    [Fig. 10B]    [Fig. 10C]
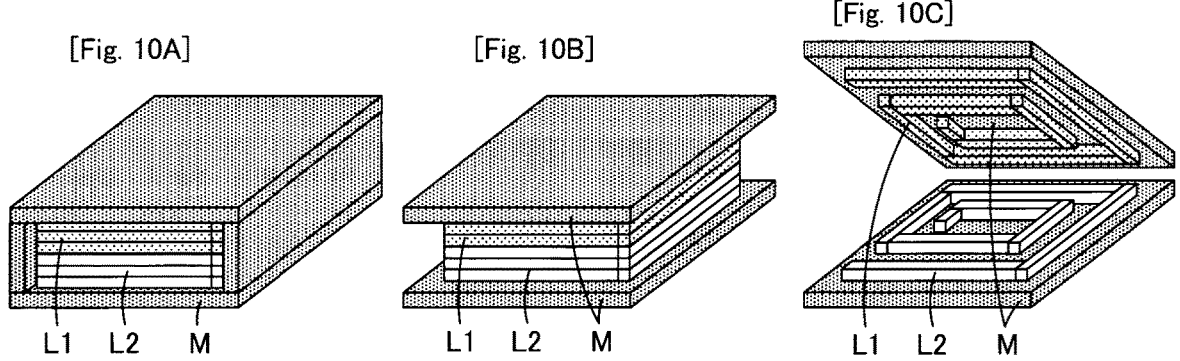
L1  L2  M    L1  L2  M    L1  L2  M
[Fig. 11A]
Mechanical structure model
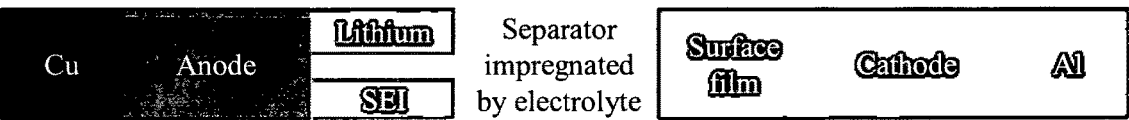
Cu    Anode    Lithium    Separator    Surface    Cathode    Al
                SEI       impregnated   film
                          by electrolyte
[Fig. 11B]
Equivalent circuit model
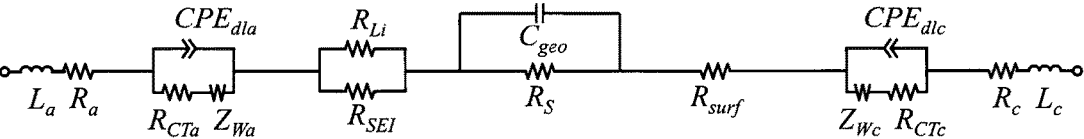
[Fig. 11C]
Simplified equivalent circuit model
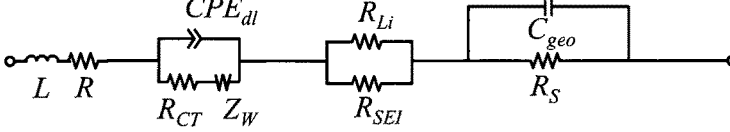
[Fig. 11D]
Equivalent circuit model corresponding to high-frequency function
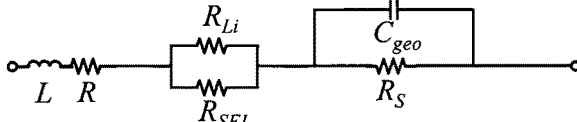

[Fig. 12]
$$Z(\omega) = R + R_{SEI} + \frac{R_{Li}R_S}{R_{Li} + R_S} + \frac{R_S}{1 + \omega^2 C_{geo}^2 R_S^2} \quad \cdots \text{Expression}(1)$$
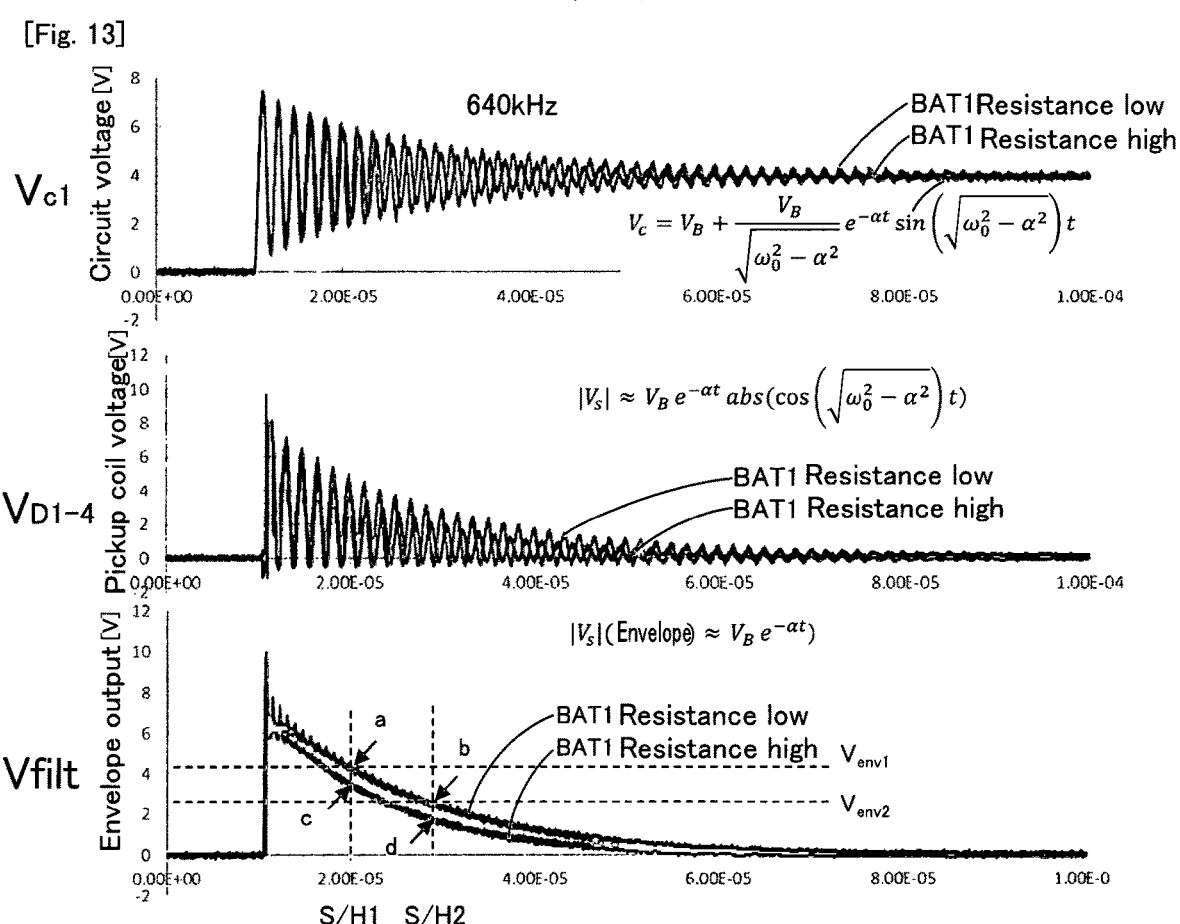
[Fig. 13]

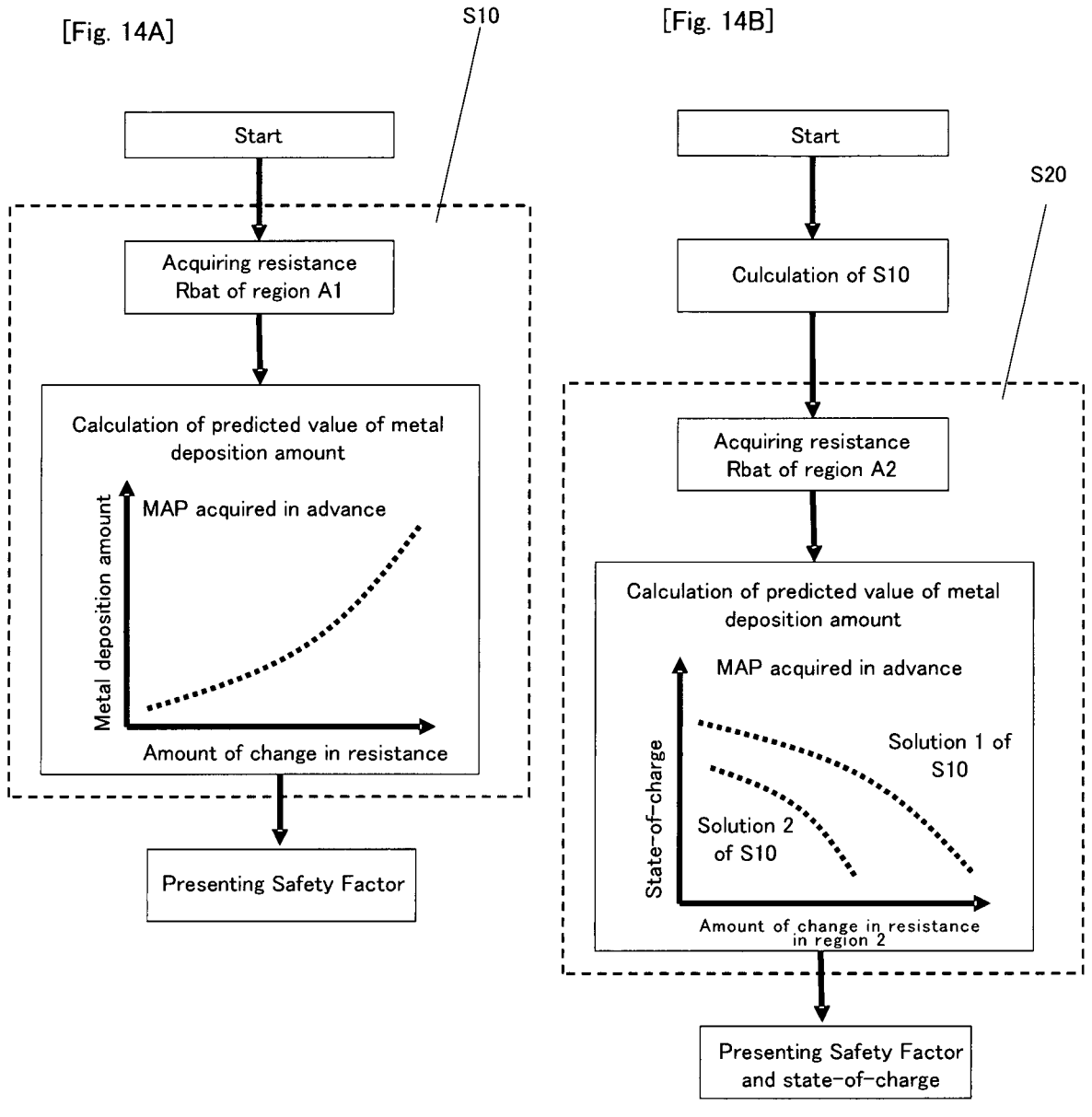

[Fig. 15]

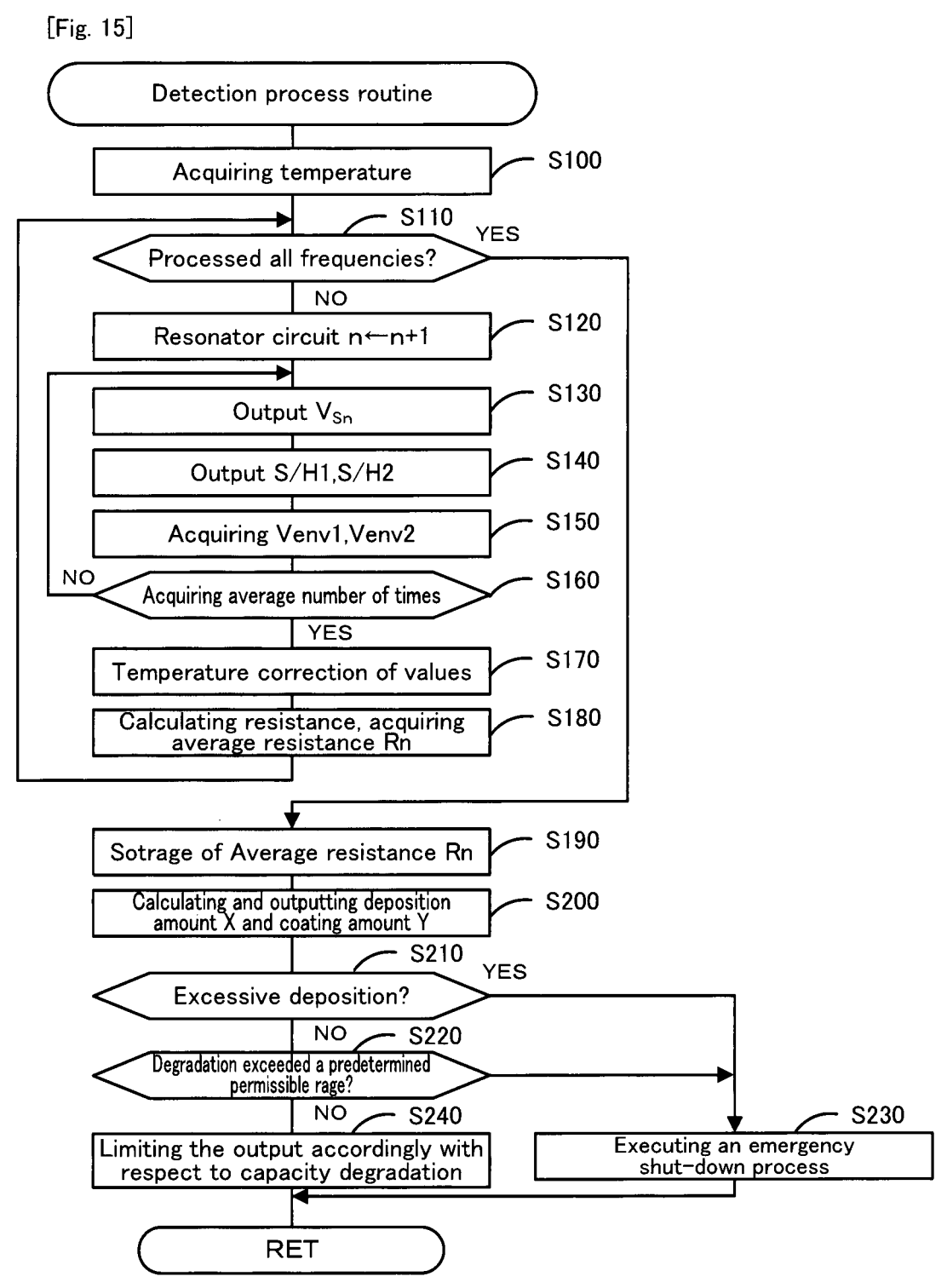

Detection process routine

Acquiring temperature — S100

S110

Processed all frequencies?    YES

NO

Resonator circuit $n \leftarrow n+1$ — S120

Output $V_{Sn}$ — S130

Output S/H1,S/H2 — S140

Acquiring Venv1,Venv2 — S150

NO    Acquiring average number of times — S160

YES

Temperature correction of values — S170

Calculating resistance, acquiring average resistance Rn — S180

Sotrage of Average resistance Rn — S190

Calculating and outputting deposition amount X and coating amount Y — S200

S210

Excessive deposition?    YES

NO    S220

Degradation exceeded a predetermined permissible rage?

NO    S240

Limiting the output accordingly with respect to capacity degradation

Executing an emergency shut-down process — S230

RET

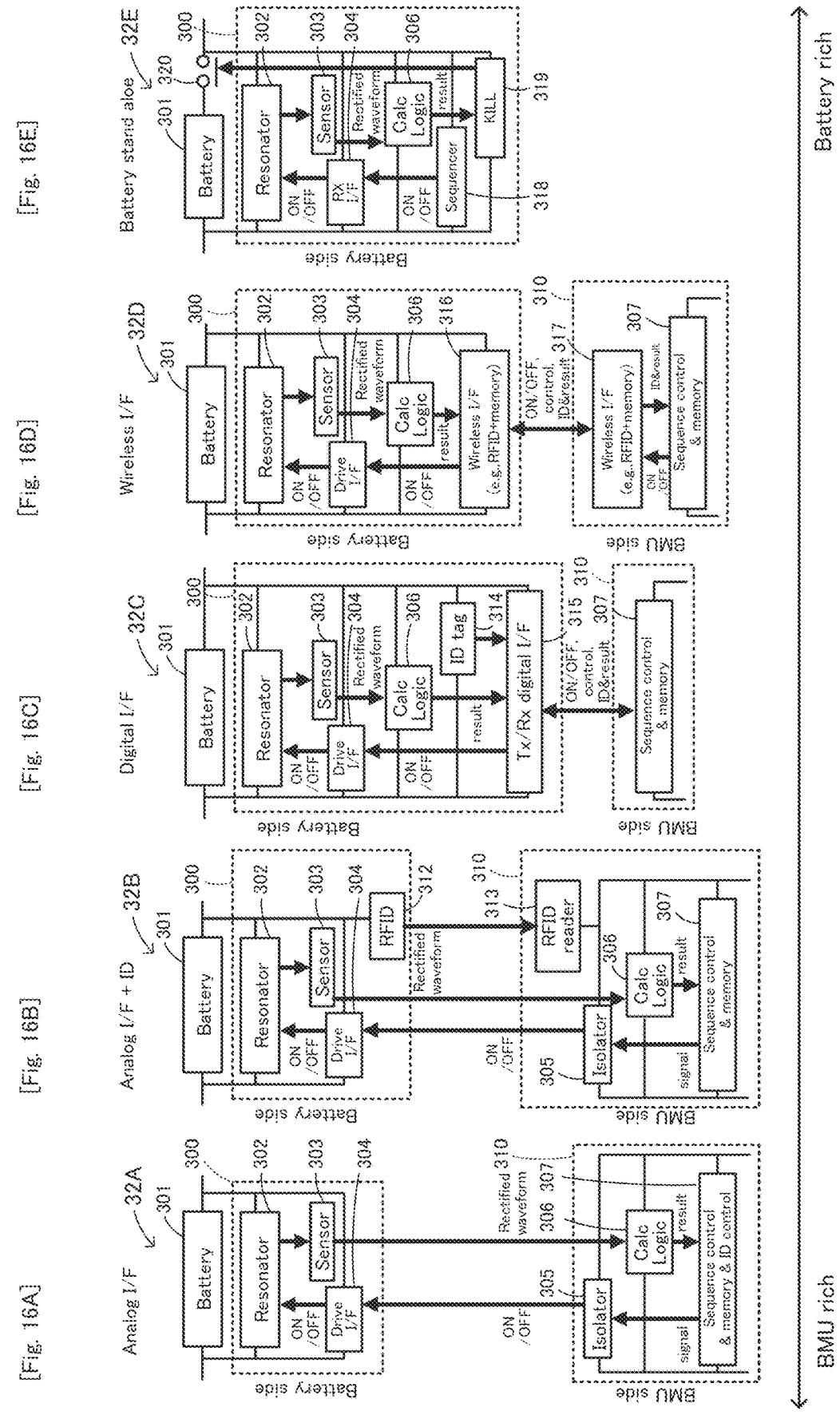

[Fig. 17]
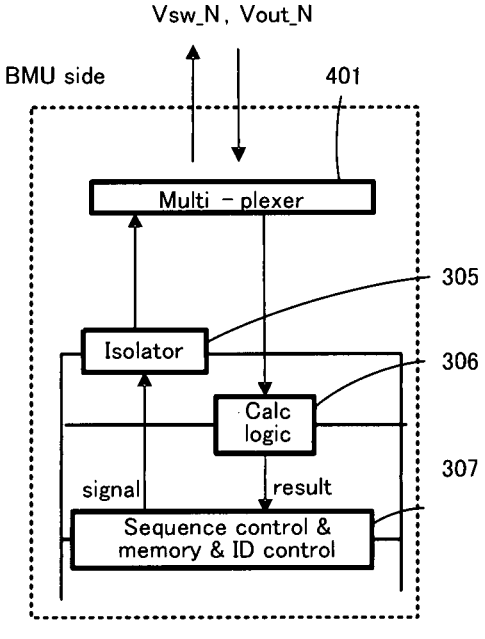
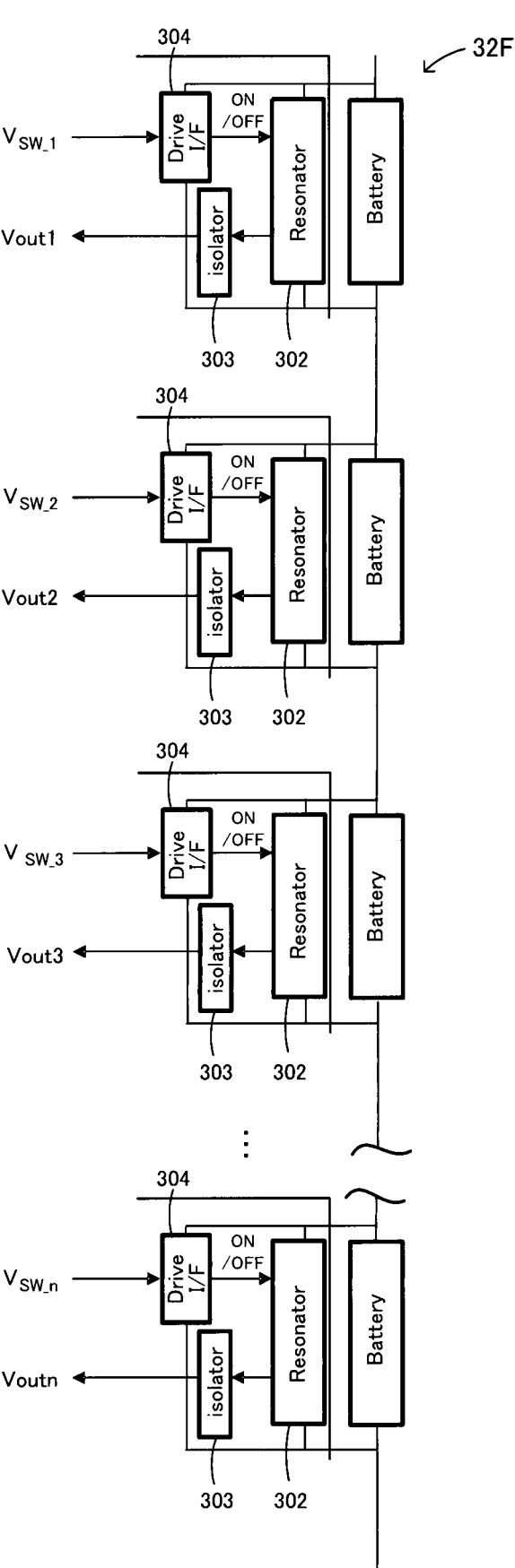

[Fig. 18]
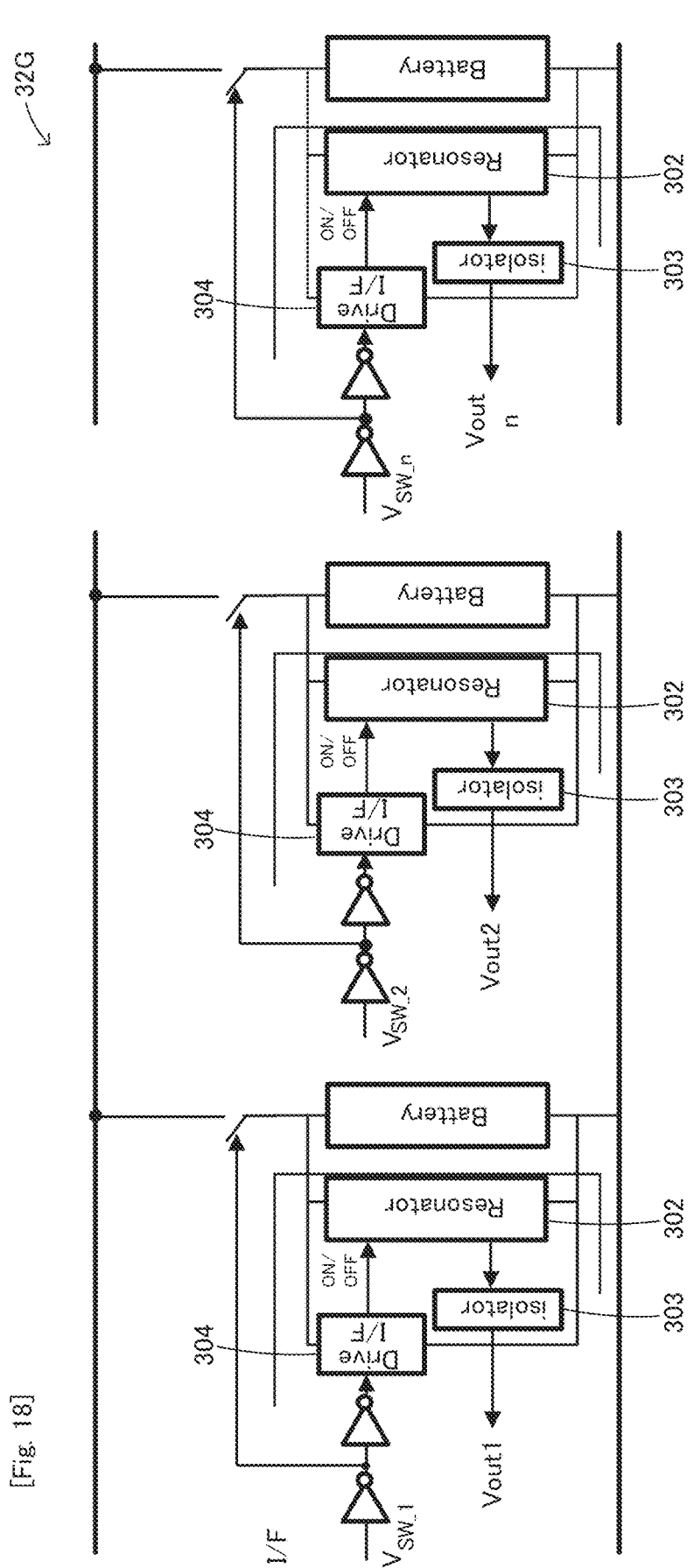

[Fig. 19]
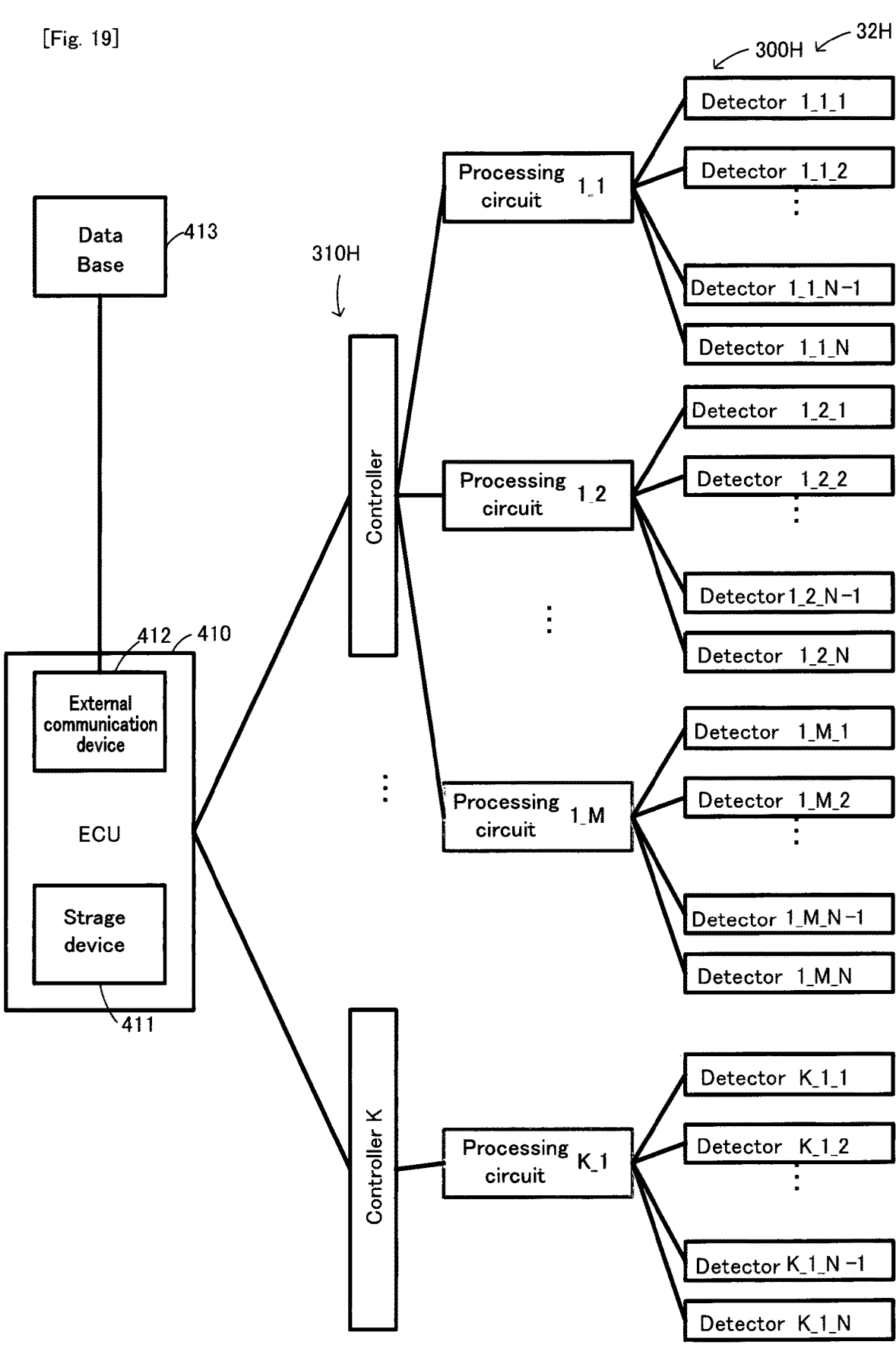

[Fig. 20]
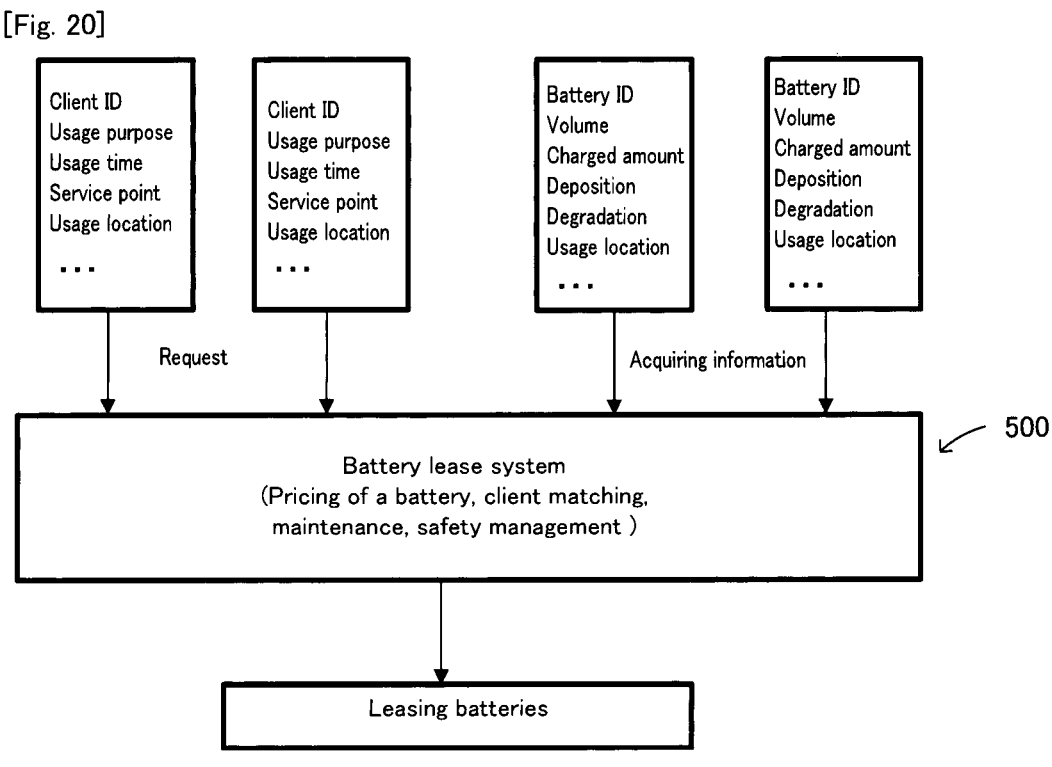
[Fig. 21]
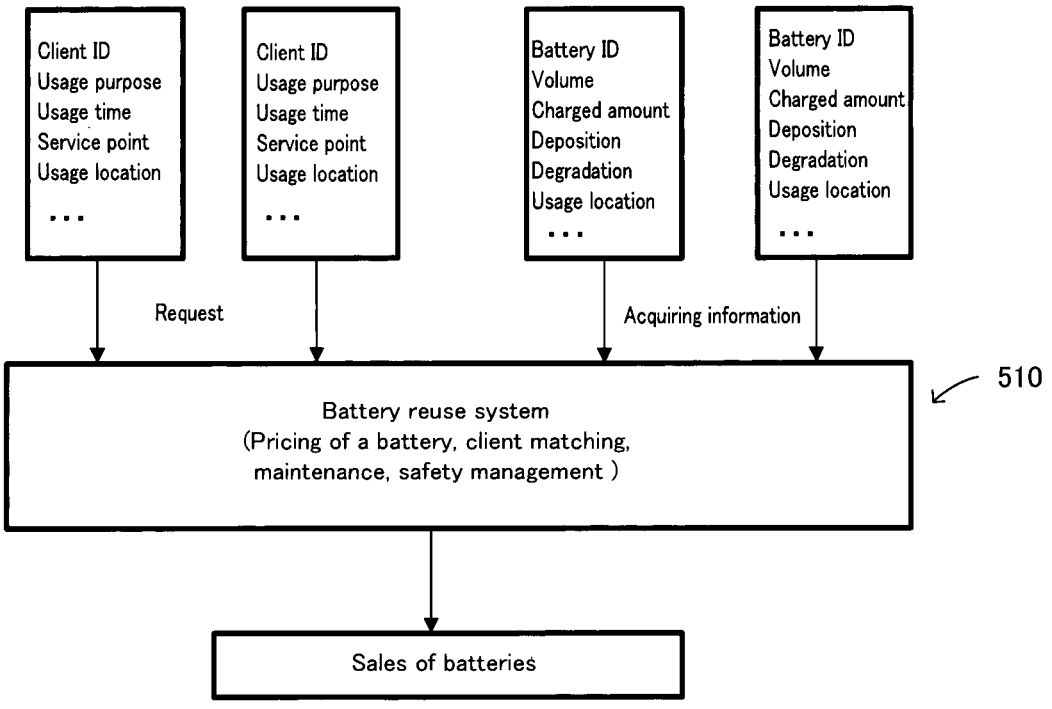

[Fig. 22]
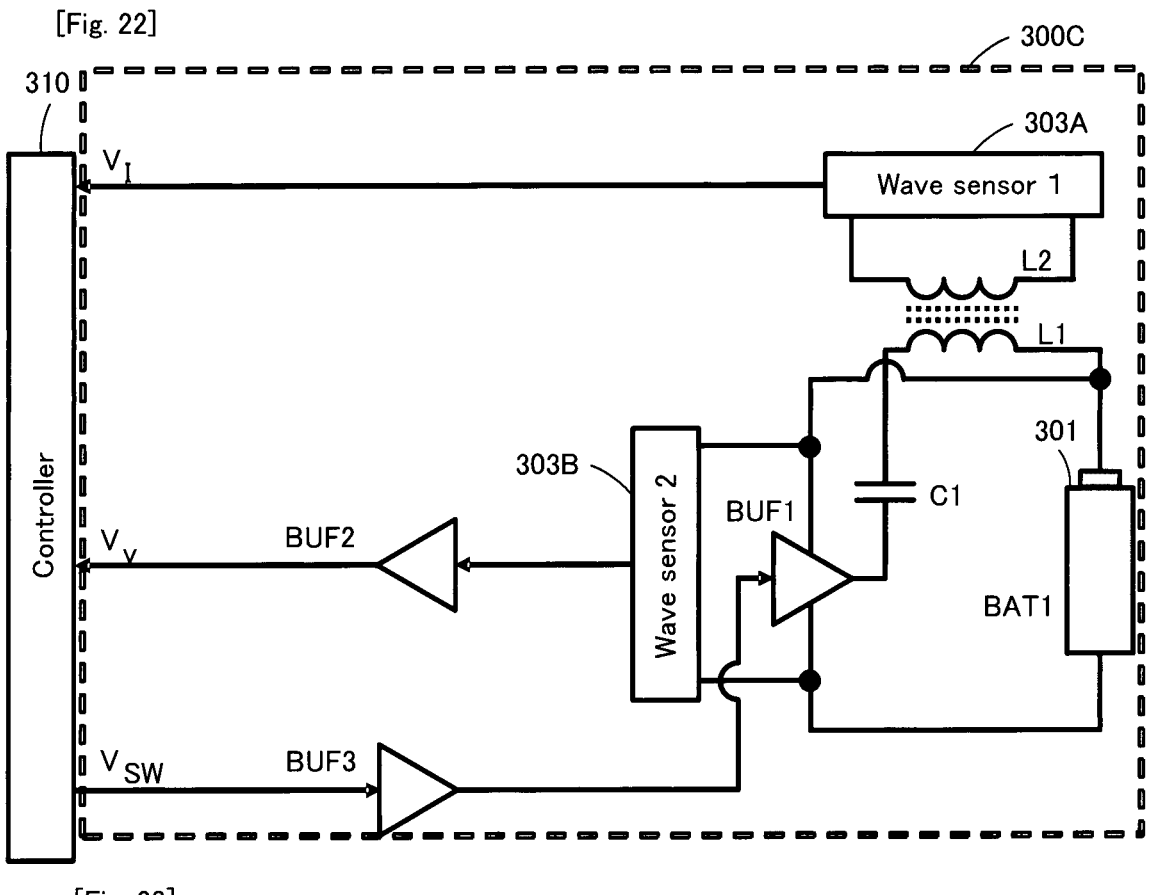
[Fig. 23]
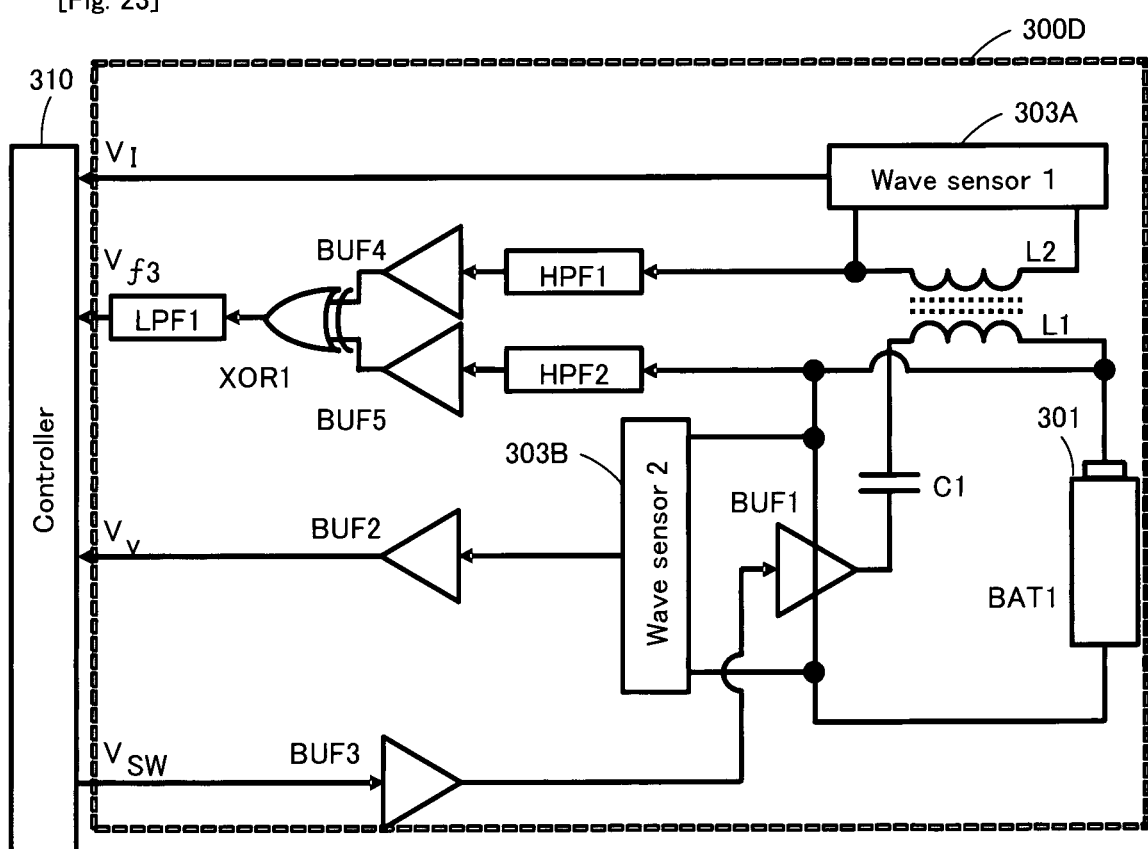

[Fig. 24]
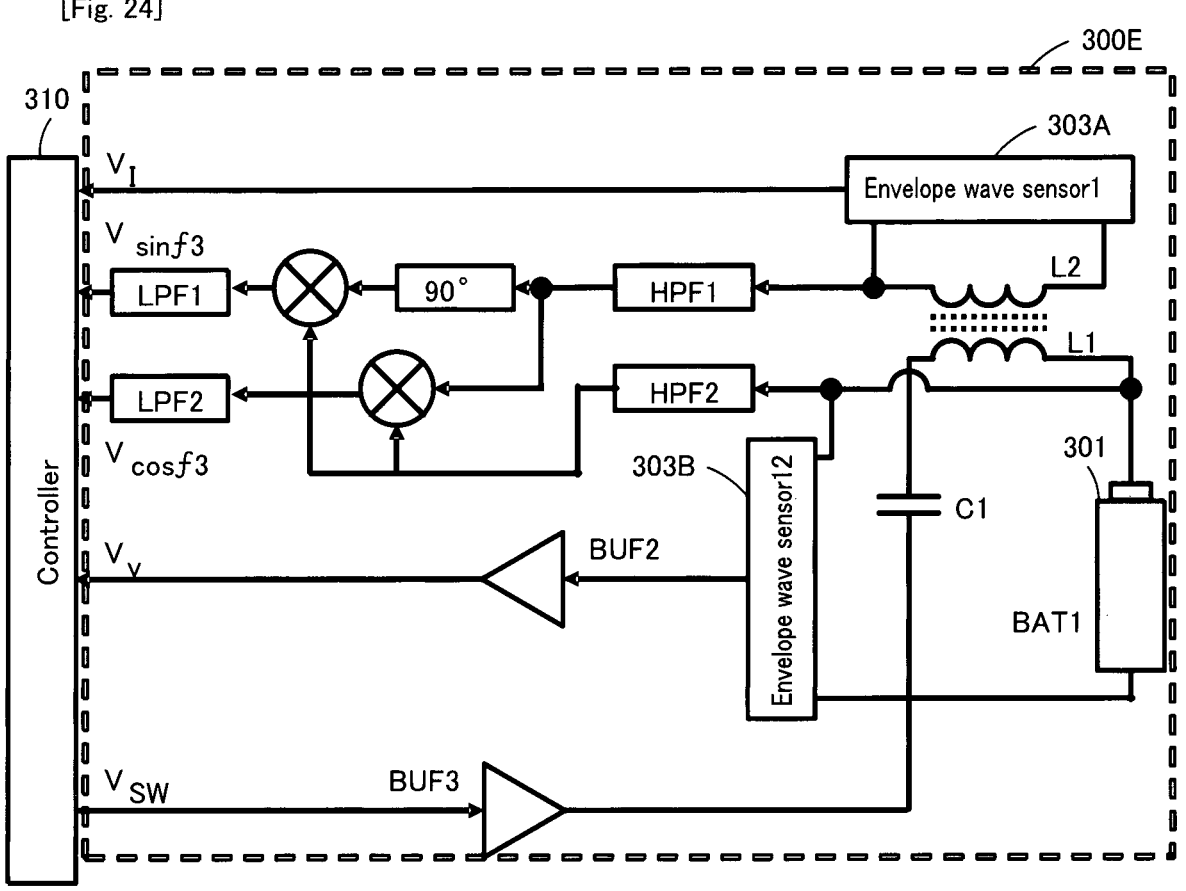

DETECTION DEVICE, MANAGEMENT APPARATUS, AND DETECTION METHOD

TECHNICAL FIELD

This description discloses detection devices, management apparatuses, and detection methods.

BACKGROUND ART

In the related art, a proposed method for determining the degradation of a power storage device involves, for example, measuring the battery impedance at a plurality of frequencies and detecting corrosive degradation in a collector of a lead storage battery based on a real number component of the impedance (e.g. see Patent Literature 1). A proposed method for determining the degradation of a lithium-ion secondary battery involves measuring the freezing temperature and the volume of an electrolytic solution and using these measured values to determine the percentage of an amount of decrease in capacity caused by lithium deposition (e.g., see Patent Literature 2). In this degradation determination method, a decrease in capacity caused by material degradation and a decrease in capacity caused by lithium deposition can be calculated accurately.

CITATION LIST

Patent Literature

PTL 1: JP 6436271 B
PTL 2: JP 2018-200800 A

SUMMARY OF INVENTION

Technical Problem

However, in Patent Literature 1 mentioned above, the corrosion-related degradation in the collector of the lead storage battery is taken into consideration, while the lithium-deposition-related degradation in the lithium-ion secondary battery is not taken into consideration. Patent Literature 2 mentioned above is not a simple technique since it requires the measurement of the freezing temperature of the electrolytic solution. Thus, a novel technique has been in demand.

The present disclosure has been made in view of the problems mentioned above, and a main object thereof is to provide a novel detection device, management apparatus, and detection method that can detect the state of a lithium-ion secondary battery by using a more simplified configuration and an easier technique.

Solution to Problem

After performing diligent studies for achieving the aforementioned object, the present inventors have discovered that a battery real part impedance can be estimated from resonant-current attenuation characteristics after a specific frequency vibration is applied to a lithium-ion secondary battery by using a resonator circuit, and that the state inside the battery, such as the amount of lithium deposition and the formation of a coating, can further be estimated from this battery resistance, and have reached the completion of the invention to be disclosed in this description.

Specifically, a detection device to be disclosed in this description detects a state of a lithium-ion secondary battery. The detection device includes a detector and a controller.

The detector has at least one resonator circuit applying at least one specific frequency vibration to the lithium-ion secondary battery, measures an attenuation characteristic of at least one resonant current, and outputs the attenuation characteristic as a detection signal. The controller detects lithium deposition and/or presence of foreign metal inside the lithium-ion secondary battery by using the detection signal of the attenuation characteristic acquired from the detector.

A management apparatus to be disclosed in this description manages the lithium-ion secondary battery based on information acquired from the aforementioned detection device. The management apparatus includes a management unit that uses a detection result, output from the controller, about the lithium deposition inside the lithium-ion secondary battery to utilize the lithium-ion secondary battery while limiting usage thereof based on a remaining volume of active lithium.

A detection method to be disclosed in this description is for detecting a state of a lithium-ion secondary battery. The detection method includes: an output step for applying at least one specific frequency vibration to the lithium-ion secondary battery, measuring an attenuation characteristic of at least one resonant current, and outputting the attenuation characteristic as a detection signal; and a detection step for detecting lithium deposition and/or presence of foreign metal inside the lithium-ion secondary battery by using the detection signal of the attenuation characteristic acquired in the output step.

Advantageous Effects of Invention

In the detection device, the management apparatus, and the detection method according to the present disclosure, the state of the lithium-ion secondary battery can detected by using a more simplified configuration and an easier technique. The reason that the present disclosure exhibits such an advantage is assumed as follows. For example, the battery resistance can be estimated from the resonant-current attenuation characteristics after the specific frequency vibration is applied to the lithium-ion secondary battery by using the resonator circuit. Furthermore, for example, the internal state, such as the amount of lithium deposition and the formation of a coating, inside the battery can be estimated from the battery resistance. The present disclosure can use the detector of the simple resonator circuit capable of detecting the cell state in an onboard fashion while the lithium-ion secondary battery is being used. Accordingly, in the present disclosure, the state of the lithium-ion secondary battery can be detected by using a more simplified configuration and an easier technique.

BRIEF DESCRIPTION OF DRAWINGS

FIG. 1 illustrates an example of a battery management system 10.

FIG. 2 illustrates an example of a detection device 32.

FIG. 3 illustrates an example of a detector 300 and a controller 310.

FIG. 4 illustrates an example of another detector 300A and another controller 310A.

FIG. 5 illustrates an example of the detector 300.

FIG. 6 illustrates an example of another detector 300B.

FIG. 7 illustrates an example of the detector 300B.

FIG. 8 illustrates an example of the controller 310.

FIG. 9 illustrates an example of another circuit configuration.

FIG. 10 illustrates an example of inductors L1 and L2.

FIG. 11 illustrates an example of an equivalent circuit model.

FIG. 12 illustrates the relationship between the frequency and the real part of impedance in a degraded state.

FIG. 13 illustrates an example of resonant-current attenuation characteristics.

FIG. 14 is a flowchart illustrating the general outline of a calculation process for detecting the state of a cell.

FIG. 15 is a flowchart illustrating an example of a detection process routine.

FIG. 16 illustrates various modes of the detection device 32.

FIG. 17 illustrates an example of a detection device 32F having series-connected cells 301.

FIG. 18 illustrates an example of a detection device 32G having parallel-connected cells 301.

FIG. 19 illustrates an example of a detection device 32H connected to a plurality of cells 301.

FIG. 20 illustrates an example of a cell-leasing data storage system.

FIG. 21 illustrates an example of a cell-sales data storage system.

FIG. 22 illustrates an example of another detector 300C.

FIG. 23 illustrates another example of another detector 300D.

FIG. 24 illustrates another example of another detector 300E.

DESCRIPTION OF EMBODIMENTS (Battery Management System 10)

Figure 9:
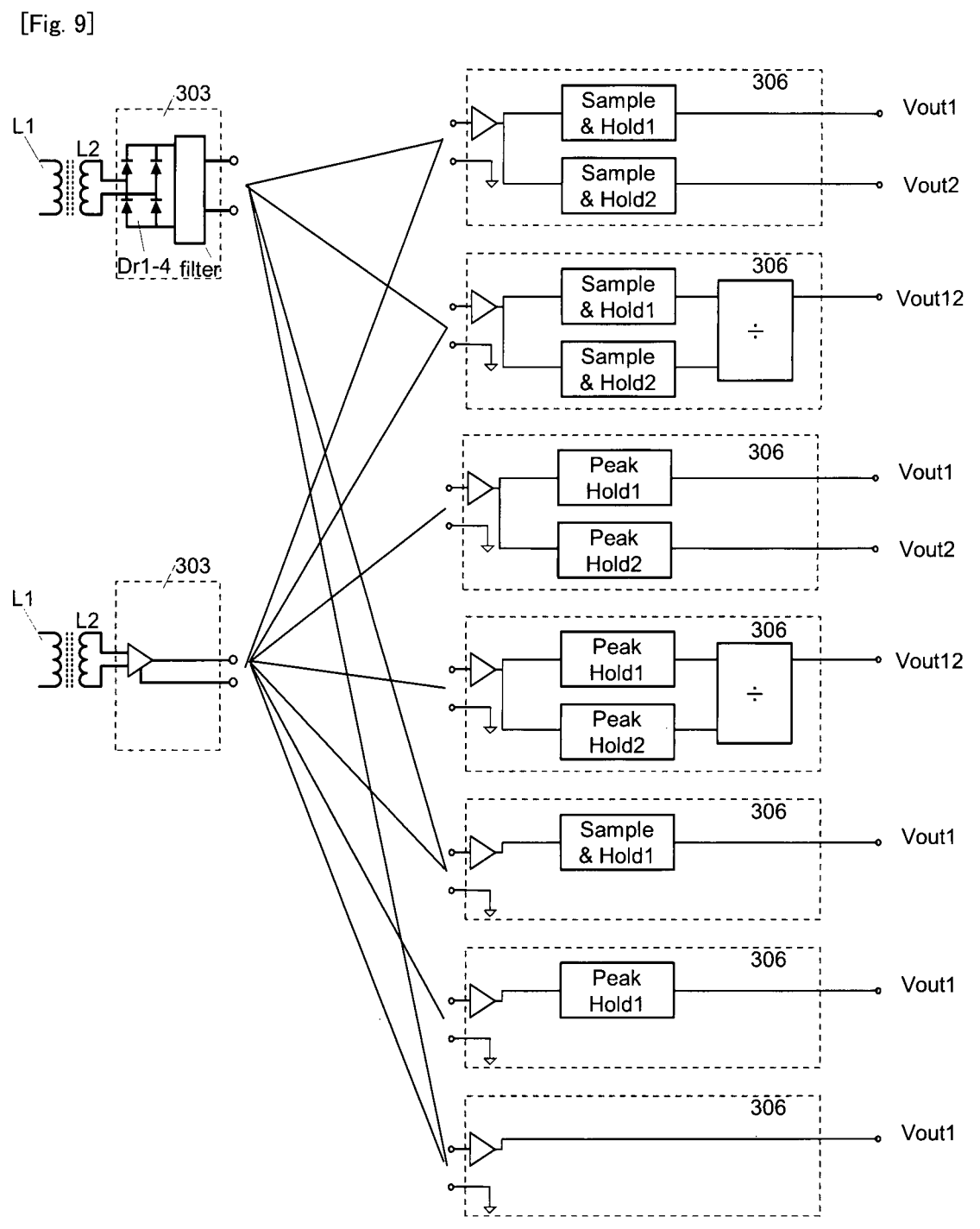

An embodiment of a detection device disclosed in this description will be described below with reference to the drawings. FIG. 1 schematically illustrates an example of a battery management system 10. FIG. 2 illustrates an example of a detection device 32. FIG. 3 illustrates an example of a detector 300 and a controller 310. FIG. 4 illustrates an example of another detector 300A and another controller 310A. FIG. 5 illustrates an example of the detector 300. FIG. 6 illustrates an example of another detector 300B. FIG. 7 illustrates an example of the detector 300B. FIG. 8 illustrates an example of the controller 310. FIG. 9 illustrates an example of another circuit configuration. FIG. 10 illustrates an example of inductors L1 and L2.

First, a cell 301 serving as a measurement target will be described. The cell 301 serves as a lithium-ion secondary battery. The cell 301 may include, for example, a positive electrode, a negative electrode, and an ion conduction medium that is interposed between the positive electrode and the negative electrode and that conducts carrier ions therebetween. For example, the positive electrode may include, as a positive active material, a sulfide containing a transition metal element or an oxide containing lithium and a transition metal element. Examples of the positive active material used may include a lithium-manganese composite oxide with $Li_{(1-x)}MnO_2$ ($0<x<1$, the same applies hereinafter) or $Li_{(1-x)}Mn_2O_4$ as a basic composition formula, a lithium-cobalt composite oxide with $Li_{(1-x)}CoO_2$ as a basic composition formula, a lithium-nickel composite oxide with $Li_{(1-x)}NiO_2$ as a basic composition formula, and a lithium-nickel-cobalt-manganese composite oxide with $Li_{(1-x)}Ni_a$-$Co_bMn_cO_2$ ($a+b+c=1$) as a basic composition formula. The "basic composition formula" may include other elements. The negative electrode may include a composite oxide containing a carbon material or lithium as a negative active material. Examples of the negative active material include lithium, a lithium alloy, an inorganic compound, such as a tin compound, a carbon material capable of occluding and releasing lithium ions, a composite oxide containing a plurality of elements, and a conductive polymer. Examples of the carbon material include a coke group, a glassy carbon group, a graphite group, a non-graphitizable carbon group, a pyrolytic carbon group, and carbon fiber. Of these examples, the graphite group, such as artificial graphite or natural graphite, is preferred. Examples of the composite oxide include a lithium-titanium composite oxide and a lithium-vanadium composite oxide. The ion conduction medium may be, for example, an electrolytic solution having a supporting electrolyte dissolved therein. The supporting electrolyte may be, for example, lithium salt, such as $LiPF_6$ or $LiBF_4$. Examples of the solvent of the electrolytic solution include a carbonate group, an ester group, an ether group, a nitrile group, a furan group, a sulfolane group, and a dioxolane group, which may be used singularly or be mixed with each other. In detail, the carbonate group may be a ring carbonate group, such as an ethylene carbonate, a propylene carbonate, a vinylene carbonate, a butylene carbonate, or a chloroethylene carbonate, or may be a chain carbonate group, such as a dimethyl carbonate, an ethyl methyl carbonate, a diethyl carbonate, an ethyl-n-butyl carbonate, a methyl-t-butyl carbonate, a di-i-propyl carbonate, or a t-butyl-i-propyl carbonate. The ion conduction medium used may be a solid ion conductive polymer, an inorganic solid electrolyte, a mixture of an organic polymer electrolyte and an inorganic solid electrolyte, or inorganic solid powder bound together by an organic binder. The cell 301 may have a separator disposed between the positive electrode and the negative electrode.

The battery management system 10 is, for example, a system that sells and manages the use of each manufactured lithium-ion secondary battery (i.e., cell 301). The battery management system 10 includes a producer server 20, a management server 25, and a battery system 30. The producer server 20 is owned by a producer who manufactures the cell 301 and serves as a management apparatus that manages the lithium-ion secondary battery based on information acquired from the detection device 32. The producer server 20 may cause a management unit 21 to perform quality control by acquiring information related to the presence of foreign metal contained in the cell 301 from the battery system 30.

The management server 25 is owned by a manager who manages the cell 301 during use and serves as a management apparatus that manages the lithium-ion secondary battery based on information acquired from the detection device 32. The management server 25 causes storage units 27 and 28 to store, for example, information related to the state of the cell 301 acquired from the battery system 30, and causes a management unit 26 to execute a process for setting the details of recovery, replacement, and maintenance of the used cell 301. For example, the management server 25 may use a detection result, output from the detection device 32, about lithium deposition inside the lithium-ion secondary battery to utilize the lithium-ion secondary battery while limiting the usage thereof based on the remaining volume of active lithium. Furthermore, the management server 25 may use the detection result, output from the detection device 32, about the lithium deposition inside the lithium-ion secondary battery to perform a process for quantifying a residual value, including the remaining usage time, of the lithium-ion secondary battery based on the remaining volume of active lithium. Alternatively, the management server 25 may calculate a distribution value by using the detection result, output from the detection device 32, about the lithium deposition inside the lithium-ion secondary battery, and output the calculated distribution value.

The battery system 30 is a system that drives a load 31 by using the cell 301. The battery system 30 is used as, for example, a vehicle driving system or a household energy supplying system. The battery system 30 is equipped with the detection device 32 that detects the state of the cell 301. Furthermore, the battery system 30 has a sensor, such as a temperature sensor 311 that measures the temperature of the cell 301, required for managing and controlling the cell 301. The state of the cell 301 detectable by the detection device 32 includes, for example, a lithium deposition state and a degradation state, such as a state where a coating is formed. Moreover, the detection device 32 can detect a state where foreign metal is mixed inside the battery.

As shown in FIGS. 1 and 2, the detection device 32 includes the detector 300 and the controller 310. The detector 300 serves as a sensor connected to the cell 301 serving as a measurement target in an onboard fashion. The detector 300 has at least one resonator circuit 302 that applies at least one specific frequency vibration to the lithium-ion secondary battery, measures attenuation characteristics of at least one resonant current, and outputs the attenuation characteristics as a detection signal to the controller 310. As shown in FIG. 2, the detector 300 may include the at least one resonator circuit 302, a wave sensor 303 that outputs the signal output from the resonator circuit 302 as a detection signal, and a drive circuit 304 that drives the resonator circuit 302. The controller 310 serves as a battery monitoring unit (BMU) that receives the detection signal from the detector 300 and acquires and manages information related to the state of the cell 301. The controller 310 may be connected to a plurality of detectors 300. The controller 310 may detect at least one of the lithium deposition and the presence of foreign metal inside any one of cells 301 in the lithium-ion secondary battery having a plurality of parallel-connected or series-connected cells 301 connected to the detector 300. The controller 310 detects the lithium deposition and/or the presence of foreign metal inside the lithium-ion secondary battery by using the attenuation-characteristic detection signal acquired from the detector 300. As shown in FIG. 2, the controller 310 may include an isolator 305 that outputs a drive signal to the drive circuit 304 of the detector 300, a logic calculator 306 that calculates a detection signal output from the detector 300, and a main calculator 307 that outputs a drive signal to the isolator 305 and receives a detection signal from the logic calculator 306.

The detector 300 may have, for example, any one of the configurations shown in FIGS. 3 to 7 as a specific example. As shown in FIG. 3, the resonator circuit 302 is constituted of a closed circuit that includes a pickup-coil-equipped inductor L1 parallel-connected to the cell 301, a resonant capacitor C1 series-connected to the inductor L1, a resistor R1 parallel-connected to the resonant capacitor C1, and a semiconductor switch S1 series-connected to the inductor L1. The resonator circuit 302 may apply a frequency vibration in the range of 5 MHz or lower as a frequency region A1 to the cell 301. For example, the frequency region A1 may be 0.5 MHz or higher and may range between 0.8 MHz and 2 MHz inclusive. In this range, the deposition state of lithium is readily ascertainable. Alternatively, the resonator circuit 302 may apply a frequency vibration in the range of 10 MHz or higher as a frequency region A2 to the cell 301. For example, the frequency region A2 may be 100 MHz or lower and may range between 20 MHz and 40 MHz inclusive. In this range, the deposition state of a coating is readily ascertainable. The wave sensor 303 may rectify a signal output from the resonator circuit 302 and output the signal as a detection signal. For example, as shown in FIGS. 3 and 5, the wave sensor 303 may have a pickup coil L2, a rectifier circuit 308, and a filter 309. The pickup coil L2 is provided facing the inductor L1 and detects a resonant current flowing through the inductor L1. The rectifier circuit 308 may be constituted of a diode bridge having diodes Dr1 to Dr4 connected to the pickup coil L2. As shown in FIG. 5, the filter 309 may include a capacitor Cf and a resistor Rf, may filter a rectified waveform, and may output a detection signal to the controller 310 serving as a BMU. Alternatively, as shown in FIG. 4, the rectifier circuit 308 and the filter 309 may be omitted from the wave sensor 303 so long as the wave sensor 303 is capable of outputting a signal output from the resonator circuit 302 as a detection signal. The drive circuit 304 is a circuit that turns on the semiconductor switch S1. For example, as shown in FIG. 5, the drive circuit 304 may drive the semiconductor switch S1 via a drive capacitor Cx1 parallel-connected to the cell 301 by a diode Dx1 and via a buffer BUF1 supplied with electric power from the drive capacitor Cx1.

The controller 310 may have, for example, any one of the configurations shown in FIGS. 3, 4, and 8. The controller 310 may estimate a battery resistance Rbat by using voltage values Venv1 and Venv2 as resonant-current attenuation characteristics, so as to detect the lithium deposition and/or the presence of foreign metal. As shown in FIGS. 3 and 8, the logic calculator 306 may have one or more sample-and-hold circuits. The isolator 305 may have a series capacitor and may output a drive signal to the drive circuit 304. The isolator 305 may be a simple series capacitor, and the logic calculator 306 may have two to three sample-and-hold circuits. In the detection device 32, a transmission signal from the controller 310 is isolated by the isolator 305, and a signal from the detector 300 is isolated by the effect of the pickup coil. Therefore, the detection device 32 is characterized in that it has no problem with regard to performing measurement on a large-capacity module constituted of a plurality of series-connected cells 301 serving as measurement targets. The controller 310 may detect the lithium deposition and/or the presence of foreign metal inside the lithium-ion secondary battery based on a decrease in the real part of impedance when the resonator circuit 302 applies a frequency vibration in the range of 5 MHz or lower. Furthermore, the controller 310 may detect a coating formed on the electrodes of the cell 301 based on an increase in the real part of impedance when the resonator circuit 302 applies a frequency vibration in the range of 10 MHz or higher.

As shown in FIG. 4, the detection device 32 may provide the drive circuit 304 with a pickup coil, may provide the isolator 305 with a resonant coil, and may include the detector 300A and the controller 310 that physically separate the drive circuit 304 and the isolator 305 from each other and physically separate the resonator circuit 302 and the wave sensor 303 from each other. In FIG. 4, an RFID is used for an input signal and an RFID-TAG that is operable in a power-free fashion is used at the drive circuit 304 side, thereby enabling sensor operation and signal reception in a completely wireless fashion. Although the coupling coefficient may become a problem when establishing a wireless configuration, the input signal is a digital signal having a value of 1 or 0 and is thus not a problem. Moreover, since the resistance is calculated from the attenuation rate, a resonant vibration signal at the reception side can be calculated without being dependent on the coupling coefficient.

Furthermore, as shown in FIGS. 6 and 7, the detector 300B may have a plurality of resonator circuits, as in a resonator circuit 302A and a drive circuit 304A that drives the resonator circuit 302A, and a resonator circuit 302B that resonates at a frequency different from that in the resonator circuit 302A and a drive circuit 304B that drives the resonator circuit 302B. The detector 300B can use the plurality of resonator circuits parallel-connected to the cell 301 to obtain the resonant-current attenuation characteristics in a plurality of different frequency bands, such as a frequency in the range of 5 MHz or lower or a frequency in the range of 10 MHz or higher, with a relatively simple circuit configuration. In the detector 300B, the resonator circuit 302B includes a resonant capacitor C2 series-connected to the inductor L1, a resistor R21 parallel-connected to the resonant capacitor C2, and a semiconductor switch S2 series-connected to the inductor L1. Moreover, the resonator circuit 302B is driven by the drive circuit 304B that turns on the semiconductor switch S2 via a drive capacitor Cx2 parallel-connected to the cell 301 by a diode Dx2 and via a buffer BUF2 supplied with electric power from the drive capacitor Cx2.

Furthermore, FIG. 9 illustrates another configuration example of the wave sensor 303 and the logic calculator 306 that calculate an attenuation rate from a damped waveform obtained by a resonator. For example, without having to perform envelope rectification using a diode, a peak hold circuit may be used against an damped vibration waveform, so that a voltage difference required for calculating an attenuation rate can be acquired. Since the resonant frequency is fixed by L and C and the peak timing of the damped vibration can be predicted in advance, for example, the peak hold circuit may be operated to hold the peaks at the second maximum point and the fifth maximum point, so that the voltages at the two maximum points can be acquired. Alternatively, by using a high-speed ADC, the damped vibration waveform may be entirely acquired and be used for calculating the attenuation rate.

The inductors L1 and L2 may be a closed-magnetic-circuit transformer that covers the inductors L1 and L2 with a magnetic member M, as shown in FIG. 10A, may be an open-magnetic-circuit transformer with exposed side surfaces, as shown in FIG. 10B, or may be a wireless transformer that isolates the inductors L1 and L2 from each other, as shown in FIG. 10C. An appropriate option may be selected in accordance with the configuration that the detector 300 and the controller 310 have.

The operating principle of the detection device 32 will now be described. FIG. 11 illustrates an example of an equivalent circuit model of the lithium-ion secondary battery, and includes FIG. 11A illustrating a mechanical structure model, FIG. 11B illustrating a full model of an equivalent circuit, FIG. 11C illustrating a simplified equivalent circuit, and FIG. 11D illustrating an equivalent circuit model corresponding to a high-frequency function. FIG. 12 illustrates the relationship between the frequency and the real part of impedance in a degraded state. FIG. 13 illustrates an example of resonant-current attenuation characteristics. In particular, FIG. 11D illustrates an equivalent circuit obtained as a result of extracting parameters that are dominant at high frequency from the elements thereof. Table 1 shows a list of annotations related to the elements. FIG. 12 illustrates an impedance characteristic result calculated using the equivalent circuit model in FIG. 11 and Expression (1). One degradation pattern of a lithium-ion secondary battery is deposition of lithium metal inside the battery, and there is a possibility of the battery becoming unsafe as the amount of metal deposition increases. Three considerable states of the lithium-ion secondary battery include an initial battery, a lithium-deposition degraded battery, and an SEI (coating) deposition degraded battery. As indicated by the region A1 in FIG. 12, it can be confirmed that the real part of impedance decreases in accordance with the amount of lithium deposition in the range of 5 MHz or lower, particularly, near 1 MHz. On the other hand, in this frequency region, it can be confirmed that the real part of impedance increases in the SEI-deposition degraded battery, as compared with the initial battery. In other words, it is clearly distinguishable whether the battery degradation is due to lithium deposition or coating deposition based on whether the real part of impedance has decreased or increased. Furthermore, it can be confirmed that the impedance increases in accordance with the amount of SEI deposition in the range of 10 MHz or higher, particularly, in the region A2 near 20 MHz. In other words, in this frequency region, it is assumable that the effect of SEI-deposition degradation is greater than in lithium-deposition degradation. Although FIG. 12 indicates a calculation result obtained using Expression (1), it is confirmed that this calculation result is correct since a measurement result obtained by using a 18650-type lithium-ion secondary battery indicates a tendency identical to that of the waveform shown in FIG. 12.

The detector 300 is characterized in being able to measure the real part of high-frequency impedance in an onboard fashion simply and accurately within a short period of time. FIG. 13 illustrates a representative operation example of a lithium-ion secondary battery having the configuration in FIG. 12. At a certain time point, a stepped on-signal is input from the controller 310 serving as a BMU via the isolator 305. In response to this signal, the drive circuit 304 uses electric power accumulated in the drive capacitor Cx1 charged by the cell 301 to drive the semiconductor switch S1, thereby turning on the semiconductor switch S1 in the resonator circuit 302. When the semiconductor switch S1 is turned on, the cell 301 charges the resonant capacitor C1 to the voltage of the cell 301 while vibrating at a resonant frequency designed in the inductor L1 and the resonant capacitor C2. The vibration in this resonating operation is damped due to a resistance component included in the resonant path, that is, the battery resistance Rbat with respect to a specific frequency included in the cell 301. Specifically, since the attenuation rate changes in accordance with the magnitude of internal impedance of the cell 301, the battery resistance Rbat can be calculated from the attenuation rate. In order to perform this calculation, a signal waveform detected by the pickup coil L2 is rectified at the diode bridge of the rectifier circuit 308, so that a vibration envelope is obtained. The battery resistance Rbat can be calculated from the voltage values Venv1 and Venv2 at multiple time points (t1 and t2) of the envelope.

Expressions (2) and (3) indicated below are an expression for the resonant current flowing through the inductor L1 and a basic expression for calculating the battery resistance Rbat from an envelope output waveform, obtained from the pickup coil L2. Expression (2) is an expression for an electric current flowing through the circuit of the detector 300 when the semiconductor switch S1 is closed at a time point t=0. Expression (3) is an expression for determining the battery resistance Rbat from the envelope voltages Venv1 and Venv2 at the time points t1 and t2. It is apparent from Expression (2) that the attenuation of the envelope changes at the resistance Rbat serving as a shoulder value of exp, and it is apparent that the value thereof can be measured from a ratio between two envelope values. This method is advantageous in that the detector 300 can be driven using the battery's own electric power (i.e., voltage V), that the configuration is simple, and that the voltage V of the battery changes depending on the charged state but is not dependent on a voltage change thereof. This is evident from the fact that the voltage V of the battery is not included in Expression (3). Moreover, this method is characterized in that the resistance with respect to a specific resonant frequency designed in the inductor L1 and the resonant capacitor C1 can be obtained in a pinpoint fashion, that the amount of electric power consumed is extremely small due to a single-shot operation, and that the two voltage values Venv1 and Venv2 can be acquired with a general-purpose sample-and-hold circuit, and is thus advantageous in that there are few problems with regard to actual implementation.

In the detector 300, the estimation accuracy is dependent on the design of the resonator circuit 302. First, the reso-nating operation needs to generate a damped vibration, and the battery resistance Rbat needs to be dominant in the resistance component of the system. When the parasitic resistance of the inductor L is defined as RL, it is preferable that RL<Rbat. As an example, in a case where the band of the resonant frequency is set to 1 MHz, a change in the battery resistance in the range of several tens to several hundreds of mΩ can be detected by setting a sharpness Q of the resonance to about 50 to 100. This can be achieved by designing the resistance of a pickup-coil-equipped reactor to a low value. Furthermore, a decrease in the resistance caused by lithium deposition can be captured in a frequency band near 1 MHz, which is a frequency high enough to be unfollowable by, for example, diffusion and reaction, is measurable, and is lower than the frequency at which the effect of orientation polarization occurs. Moreover, in the detection device 32, the attenuation characteristics are mea-sured while narrowing down to a specific frequency, so that a more plain and simple very small-size sensor circuit can be implemented in the cell 301 in an onboard fashion.

[Expression 1]

$$Z(\omega) = R + R_{SEI} + \frac{R_{Li}R_S}{R_{Li} + R_S} + \frac{R_S}{1 + \omega^2 C_{geo}^2 R_S^2} \qquad \text{Expression (1)}$$

[Expression 2]

$$I(t) = \frac{V}{\sqrt{\frac{L1}{C1} - \left(\frac{Rbat}{2}\right)^2}} e^{\frac{Rbat}{2L1}t} \sin\sqrt{\frac{1}{L1C1} - \left(\frac{Rbat}{2L1}\right)^2} \qquad \text{Expression (2)}$$

$$Rbat = \log\left(\frac{V_{env1}}{V_{env2}}\right)^2 \times \frac{2L1}{t_2 - t_1} \qquad \text{Expression (3)}$$

TABLE 1

LIST OF SCHEMATIC PARAMETERS

| symbol | name |
|---|---|
| La | geometrical inductance of anode side |
| Lc | geometrical inductance of cathode side |
| L | sum of La and Lc |
| Cgeo | geometrical capacitance between anode and cathode |
| CPEdla | electrical double layer capacitance of anode side |
| CPEdlc | electrical double layer capacitance of cathode side |
| CPEdl | sum of CPEdla and CPEdlc |
| Ra | parasitic ohmic resistance of anode side |
| Rc | parasitic ohmic resistance of cathode side |
| R | sum of Ra, Rc and Rsurf |

TABLE 1-continued

LIST OF SCHEMATIC PARAMETERS

| symbol | name |
|---|---|
| $R_{CTa}$ | charge transfer resistance of anode side |
| $R_{CTc}$ | charge transfer resistance of cathode side |
| $R_{CT}$ | sum of $R_{CTa}$ and $R_{CTc}$ |
| $R_{Li}$ | resistance of Lithium dendrite |
| Rs | resistance of electrolyte |
| $R_{SEI}$ | resistance of SEI |
| $R_{surf}$ | resistance of cathode surface film |
| $Z_{Wa}$ | Warburg impedance of anode side |
| $Z_{Wc}$ | Warburg impedance of cathode side |
| $Z_W$ | sum of $Z_{Wa}$ and $Z_{Wc}$ |

(Detection Method)

The following description relates to the operation of the detection device 32 according to this embodiment having this configuration, specifically, a detection method executed by the detection device 32 for detecting the state of the lithium-ion secondary battery. This detection method may include, for example, an output step for applying at least one specific frequency vibration to the lithium-ion secondary battery, measuring the attenuation characteristics of this resonant current, and outputting the attenuation character-istics as a detection signal, and the detection step for detecting the lithium deposition and/or the presence of foreign metal inside the lithium-ion secondary battery by using the attenuation-characteristic detection signal acquired in the output step. In the detection step, the lithium depo-sition is detected for the sake of convenience, and a case where battery degradation is detected will be mainly described.

FIG. 14 is a flowchart illustrating the general outline of a calculation process for detecting the state of a cell imple-mented in the logic calculator 306 of the controller 310, and includes FIG. 14A illustrating a calculation process in the frequency region A1 and FIG. 14B illustrating a calculation process in the frequency region A2. For example, the logic calculator 306 performs a correction calculation for correct-ing the temperature characteristics of a diode used for rectification, as well as a calculation of a degradation amount and a deposition amount by implementing a logic capable of measuring two frequencies, where necessary. Moreover, the results may be recorded in a traceable manner in a database so as to be used for determining transitions and factors for the degradation and deposition. Furthermore, by using the same principle, a change in resistance occurring when foreign metal is mixed inside the battery can be detected, and this information may be used in the producer server 20 to enhance the quality in the production process. As shown in FIG. 14A, the logic calculator 306 executes a process for acquiring the battery resistance Rbat by mea-suring the resonant-current attenuation characteristics in the frequency region A1, and obtaining a lithium-metal depo-sition amount from an amount of change in resistance by using a MAP acquired in advance (S10). For example, the MAP can be set based on the relationship between the amount of change in resistance and the lithium-metal depo-sition amount. The relationship is obtained empirically in advance from, for example, a test. Then, for example, the controller 310 presents a safety factor of the corresponding cell 301 from the obtained lithium-metal deposition amount. Alternatively, as shown in FIG. 14B, after the calculation in step S10, the logic calculator 306 executes a process for acquiring the battery resistance Rbat by measuring the resonant-current attenuation characteristics in the frequency region A2 and obtaining a state-of-charge SOC from the amount of change in resistance by using a MAP acquired in advance (S20). For example, the MAP can be set based on the relationship between the amount of change in resistance and the state-of-charge SOC. The relationship is obtained empirically in advance from, for example, a test. Then, for example, the controller 310 presents a safety factor of the corresponding cell 301 and the state-of-charge SOC.

Next, a more detailed process of the detection device 32 will be described. FIG. 15 is a flowchart illustrating an example of a detection process routine executed by the main calculator 307 of the detection device 32. For example, this routine is repeatedly executed after every predetermined time period (e.g., one minute or one hour). The main calculator 307 executes this routine by using the circuit configuration that the detector 300 and the controller 310 have. As a specific example, the following description relates to an example where the battery resistance Rbat in the frequency regions A1 and A2 is measured by using the detector 300B equipped with the resonator circuits 302A and 302B shown in FIG. 7. When this routine starts, the main calculator 307 acquires a temperature T of the cell 301 from the temperature sensor 311 (S100) and determines whether processing has been executed for all frequencies (S110). If processing has not been executed for all frequencies, a resonator circuit n is set to (n+1) (S120). In this case, n is set to a value of 0 as an initial value. For example, the main calculator 307 sets a resonator circuit 302A in a usable mode in step S120.

Subsequently, the main calculator 307 outputs a drive signal Vsn to the semiconductor switch S1 of the detector 300 via the isolator 305 (S130). The resonator circuit 302A measures the attenuation characteristics of the resonant current resonated in the frequency region A1. Then, the main calculator 307 outputs time periods S/H1 and S/H2 in which the voltage values Venv1 and Venv2 are to be measured (S140), and acquires, from the logic calculator 306, the voltage values Venv1 and Venv2 sampled and held from a detection signal output from the wave sensor 303 (S150). Subsequently, the main calculator 307 determines whether or not the voltage values have been acquired a predetermined average number of times (S160). If the voltage values have not been acquired the predetermined average number of times, the main calculator 307 executes the process from step S110 and onward. In other words, in step S120, a subsequent resonator circuit 302B is set, the attenuation characteristics of the resonant current resonated in the frequency region A2 are measured, and the voltage values Venv1 and Venv2 are acquired from the logic calculator 306.

In contrast, if the voltage values have been acquired the predetermined average number of times in step S160, the main calculator 307 executes a temperature correction at the temperature T on the voltage values Venv1 and Venv2 obtained from the logic calculator 306 (S170), determines the battery resistance Rbat from the corrected voltage values Venv1 and Venv2 and further acquires an average resistance Rn by calculation (S180), and executes the process from step S110 and onward. When the processing has been completed for all frequencies in step S110, the main calculator 307 stores the average resistance Rn in a storage unit (S190) and calculates and outputs a lithium-deposition amount X and a coating amount Y (S200). The lithium-deposition amount X and the coating amount Y can be calculated in step S10 and step S20.

Subsequently, the main calculator 307 determines whether or not excessive deposition is detected based on whether or not the deposition amount X has exceeded a predetermined permissible range (S210). This permissible range can be set to a value obtained by empirically determining a lithium-metal deposition amount that has an effect on the charge and discharge of the cell 301. If excessive deposition is not detected, the main calculator 307 determines whether or not a state of coating deposition exceeding a permissible range is detected based on whether or not the coating amount Y has exceeded a predetermined permissible range (S220). This permissible range can be set to a value obtained by empirically determining a coating-deposition amount that has an effect on the charge and discharge of the cell 301. If degradation due to coating deposition is not detected, the output of the cell 301 is limited in accordance with the degree of degradation (S240), and the routine ends.

In contrast, when excessive deposition is detected in step S210 or when degradation due to coating deposition is detected in step S220, the main calculator 307 executes an emergency shut-down process on the corresponding cell 301 (S230), and ends the routine. Accordingly, the battery system 30 stops the use of the cell 301 with lithium deposition that may possibly lead to a short-circuit, and limits the output accordingly with respect to capacity degradation, thereby appropriately sustaining the use of the cell 301.

The correspondence relationships between the components according to this embodiment and the components according to the present disclosure will now be clarified. The cell 301 according to this embodiment corresponds to a lithium-ion secondary battery according to the present disclosure, the detection device 32 corresponds to a detection device, the producer server 20 and the management server 25 correspond to a management apparatus, the detector 300 corresponds to a detector, and the controller 310 corresponds to a controller. Furthermore, the resonator circuit 302 corresponds to a resonator circuit, the wave sensor 303 corresponds to a wave sensor, the drive circuit 304 corresponds to a drive circuit, the isolator 305 corresponds to an isolator, the logic calculator 306 corresponds to a logic calculator, and the main calculator 307 corresponds to a main calculator. In this embodiment, the operation of the detection device 32 has been described to demonstrate an example of a detection method according to the present disclosure.

The detection device 32 according to this embodiment described above can detect degradation of the lithium-ion secondary battery by using a more simplified configuration and an easier technique. The reason that the detection device 32 exhibits such an advantage is assumed as follows. For example, the battery resistance Rbat can be estimated from the resonant-current attenuation characteristics after a specific frequency vibration is applied to the lithium-ion secondary battery by using the resonator circuit 302. Furthermore, for example, the internal state, such as the amount of lithium deposition and the formation of a coating, inside the battery can be estimated from the battery resistance Rbat. This detection device 32 can use the detector 300 of the simple resonator circuit 302 capable of detecting the cell state in an onboard fashion while the lithium-ion secondary battery is being used, so that degradation of the lithium-ion secondary battery can be detected by using a more simplified configuration and an easier technique. Moreover, the detection device 32 can estimate the percentage of metal deposition relative to the degradation state by using the battery resistance Rbat determined in the two frequency regions A1 and A2. In particular, the amount of lithium-metal deposition inside the battery can be estimated from a change in the real part of impedance in the frequency region A1. Moreover, the amount of coating deposition can be estimated using the battery resistance Rbat determined in the frequency region A2, and can be combined with the amount of lithium-metal deposition, so that an amount of lost lithium, that is, degradation of the lithium-ion secondary battery, can be estimated more accurately.

Furthermore, the detection device 32 is capable of capturing a decrease in resistance caused by lithium deposition in a frequency band near 1 MHz, which is a frequency high enough to be unfollowable by, for example, diffusion and reaction, is measurable, and is lower than the frequency at which the effect of orientation polarization occurs. Moreover, a relatively simple circuit including, for example, the resonator circuit 302, the wave sensor 303, the drive circuit 304, the isolator 305, and the logic calculator 306 is used while narrowing down to a specific frequency, so that a simple very small-size sensor circuit can be implemented in the battery system 30. The detection device 32 can estimate the amount of lithium deposition nondestructively formed inside the lithium-ion secondary battery, and can shut down the cell 301 during its use with reference to the permissible range. Moreover, the amount of coating can be estimated, and the output is limited in accordance with the amount of coating, so that safer use of the cell 301 can be ensured.

The present disclosure is not limited whatsoever to the above embodiment and may be implemented in various modes within the technical scope of the present disclosure.

For example, FIG. 16 illustrates various modes of the detection device 32, and includes FIG. 16A illustrating an analog-interface detection device 32A, FIG. 16B illustrating an analog-interface and ID-managing detection device 32B, FIG. 16C illustrating a digital-interface detection device 32C, FIG. 16D illustrating a wireless-interface detection device 32D, and FIG. 16E illustrating a battery-standalone detection device 32E. FIG. 16 illustrates implementation examples of the detector 300 and the controller 310. In the detection device 32B, the detector 300 is provided with an RFID 312 that provides identification information ID of the cell 301 for facilitating identification, and the controller 310 is provided with an RFID 313, so that a detection result of the cell 301 and the identification information ID are outputtable in correspondence with each other. Thus, the cell 301 is easily identifiable in the producer server 20, the management server 25, and a display unit of the detection device 32 serving as output destinations. In the detection device 32C, the detector 300 is provided with an ID tag 314 and a digital interface (I/F) 315, so that information can be exchanged with the main calculator 307 via the digital I/F 315. In the detection device 32C, the controller is simplified, whereas the detector and the battery have higher functionality. In the detection device 32D, the detector 300 is provided with a wireless I/F 316, so that information can be exchanged with the main calculator 307 in a wireless fashion. In the detection device 32E, the functions of the controller 310 are provided within the detector 300, and the detector 300 includes a sequencer 318 and a shut-down circuit 319. Furthermore, the cell 301 is series-connected to an irreversible switch 320. The sequencer 318 periodically outputs a drive signal to the drive circuit 304. When the shut-down circuit 319 determines that the cell 301 is in an abnormal state based on information acquired from the logic calculator 306, the shut-down circuit 319 turns off the irreversible switch 320 to stop the use of the cell 301. The detection device 32E can similarly detect degradation of the lithium-ion secondary battery by using a more simplified configuration and an easier technique.

Although the above embodiment described above relates to the battery system 30 equipped with the single cell 301, the embodiment is not particularly limited to this. The detection device 32 may be used in a battery system 30 having series-connected cells 301 or may be used in a battery system 30 having parallel-connected cells 301. FIG. 17 illustrates an example of a detection device 32F having series-connected cells 301. FIG. 18 illustrates an example of a detection device 32G having parallel-connected cells 301. In the detection device 32F, the controller 310 is provided with a multiplexer 401. The multiplexer 401 executes multiplexing so as to drive each detector 300 and acquire a detection signal therefrom.

FIG. 19 illustrates an example of a detection device 32H used in a battery system equipped with a battery module constituted of a plurality of cells 301. In the detection device 32H, detectors 300H are implemented in the respective cells 301 in the battery module constituted of the plurality of cells 301, and the controller 310 serving as a BMU performs multiplexing, so that the state of each cell 301 can be easily measured. For example, the detection device 32H may be used in a system that uses a battery in an electric vehicle equipped with a plurality of battery modules. The detection device 32H connects the detectors 300H to the respective cells 301, connects a controller 310H serving as a BMU to the plurality of detectors 300H, uses a superior ECU 410 to collect a signal from the controller 310H, and stores a large-volume data storage result that is traceable by using an external communication device. The ECU 410 includes a storage device 411 and an external communication device 412, and can store a detection result of the detection device 32H and provide the detection result to, for example, an external database 413. By providing a threshold value for a detection value within the system, battery protection operation (control), including suppressing the output of the system, can be performed in the ECU 410. As shown in FIG. 1, measurement data transmitted from a battery utilization system of, for example, an electric vehicle is stored in storage units B and D together with other usage records (such as travel data). The management server 25 that manages the storage units 27 and 28 is managed by the management unit 26 having a computing system, and information about, for example, recovery, replacement, and maintenance can be provided to the battery system 30 by using usage records. Furthermore, an assembly manufacturer using the producer server 20 can acquire the detection result of the detection device 32, and the management unit 21 having a computing system can use the detection result for enhancing the quality.

FIG. 20 illustrates an example of a cell-leasing data storage system. FIGS. 20 and 21 each illustrate an example of a service that can be provided by a manager. For example, by setting a management algorithm for managing leasable batteries as a computing system, a leasing service that can manage safe usage can be provided. As shown in FIG. 20, a battery lease system 500 acquires information about a client ID, usage purpose, usage time, service point, and usage location from a client. Furthermore, the battery lease system 500 acquires a battery ID, state-of-charge SOC, charged amount, lithium-deposition amount, degradation state, and usage location of each used battery module. Then, the battery lease system 500 executes pricing of a battery module to be leased, client matching, maintenance, and safety management, so that an appropriate battery module can be leased to the client.

FIG. 21 illustrates an example of a cell-sales data storage system. For example, by setting an algorithm for managing degradation and a safety factor as a computing system, a resales service for reusable batteries can be established. As shown in FIG. 21, a battery reuse system 510 acquires information about a client ID, usage purpose, usage time, service point, and usage location from a client. Furthermore, the battery reuse system 510 acquires a battery ID, state-of-charge SOC, charged amount, lithium-deposition amount, degradation state, and usage location of each used battery module. Then, the battery reuse system 510 executes pricing of a battery module to be sold to reuse, client matching, maintenance, and safety management, so that an appropriate reusable battery module can be sold to the client.

Although the above embodiment relates to the detection device 32 having a circuit designed in view of the real part of impedance alone, the embodiment is not particularly limited to this. The circuit may be designed in view of the imaginary part of impedance. FIG. 22 illustrates an example of another detector 300C. FIG. 23 illustrates another example of another detector 300D. FIG. 24 illustrates another example of another detector 300E. In each of the detectors 300C to 300E shown in FIGS. 22 to 24, a wave sensor 2 in addition to a wave sensor 1 are parallel-connected to the cell 301, and a detection signal is output to the controller 310 from the wave sensor 2 via the buffer BUF2. The detector 300D in FIG. 23 includes a high-pass filter HPF1 series-connected to the pickup coil L2, a high-pass filter HPF2 series-connected to the cell 301, and a XOR gate XOR1 connected to the high-pass filter HPF1 via a buffer BUF4 and connected to the high-pass filter HPF2 via a buffer BUF5. The XOR gate XOR1 is connected to the controller 310 via a low-pass filter LPF1, and outputs a voltage Vf3 to the controller 310. In addition to the configuration of the detector 300D, the detector 300E in FIG. 24 provides a phase difference by causing the end of the high-pass filter HPF1 to bifurcate, and outputs voltages Vsinf3 and Vcosf3 to the controller 310 via low-pass filters LPF1 and LPF2. By using the configurations shown in FIGS. 22 to 24, the detection accuracy can be further increased.

The present application claims priority from Japanese Patent Application No. 2021-100855, filed on Jun. 17, 2021, the entire contents of which are incorporated herein by reference.

INDUSTRIAL APPLICABILITY

The detection device, the management apparatus, and the detection method disclosed in this description are applicable to the technical field for detecting the state of a lithium-ion secondary battery.

REFERENCE SIGNS LIST

10 battery management system
20 producer server
21 management unit
25 management server
26 management unit
27 storage unit
28 storage unit
30 battery system
31 load
32, 32A to 32H detection device
300, 300A to 300H detector
301 cell
302A, 302B resonator circuit
303, 303A, 303B wave sensor
304, 304A, 304B drive circuit
305 isolator
306 logic calculator
307 main calculator
308 rectifier circuit
309 filter
310, 310H controller
311 temperature sensor
312 RFID
313 RFID
314 ID tag
315 digital I/F
316 wireless I/F
318 sequencer
319 shut-down circuit
320 irreversible switch
401 multiplexer
410 ECU
411 storage device
412 external communication device
413 database
500 battery lease system
510 battery reuse system
A1, A2 frequency region
BUF1 to BUF5 buffer
HPF1, HPF2 high-pass filter
LPF1, LPF2 low-pass filter
C1 resonant capacitor
Cf filter capacitor
Cx1 drive capacitor
Dx1 drive diode
Dr1 to Dr4 rectifier diode
L1 inductor
L2 pickup coil
M magnetic member
R1 resistor
Rf filter resistor
Rbat battery resistance
S1, S2 semiconductor switch

The invention claimed is:

1. A detection device that detects a state of a lithium-ion secondary battery, the detection device comprising:

a detector having at least one resonator circuit that applies at least one specific frequency vibration to the lithium-ion secondary battery and a drive circuit that drives the at least one resonator circuit, the detector measuring an attenuation characteristic of at least one resonant current of the at least one resonator circuit driven by the drive circuit, and outputting the measured attenuation characteristic as a detection signal, wherein one end of the at least one resonator circuit is connected to one pole of the lithium-ion secondary battery and another end of the at least one resonator circuit is connected to another pole of the lithium-ion secondary battery; and a controller that detects lithium deposition and/or presence of foreign metal inside the lithium-ion secondary battery by using the detection signal output from the detector.

2. The detection device according to claim 1, wherein the controller detects the lithium deposition and/or the presence of the foreign metal by estimating a battery resistance using voltage values at a plurality of time points as the attenuation characteristic of the at least one resonant current.

3. A detection device that detects a state of a lithium-ion secondary battery, the detection device comprising:

a detector having at least one resonator circuit that applies at least one specific frequency vibration to the lithium-ion secondary battery, the detector measuring an attenuation characteristic of at least one resonant current and outputting the attenuation characteristic as a detection signal; and a controller that detects lithium deposition and/or presence of foreign metal inside the lithium-ion secondary battery by using the detection signal output from the detector, wherein the detector includes the at least one resonator circuit, a wave sensor that rectifies a signal output from the at least one resonator circuit and outputs the signal as the detection signal, and a drive circuit that drives the at least one resonator circuit.

4. The detection device according to claim 3, wherein the detector includes a closed circuit, the wave sensor, and the drive circuit, the closed circuit being constituted of the at least one resonator circuit including a pickup-coil-equipped first inductor parallel-connected to the lithium-ion secondary battery, a resonant capacitor series-connected to the first inductor, and a semiconductor switch series-connected to the first inductor, the wave sensor having a pickup-coil-equipped second inductor that detects a resonant current flowing through the first inductor, a rectifier circuit constituted of a diode bridge connected to the second inductor, and a filter that includes a capacitor and a resistor, filters a rectified waveform, and outputs the detection signal, the drive circuit turning on the semiconductor switch via a drive capacitor parallel-connected to the lithium-ion secondary battery and via a buffer supplied with electric power from the drive capacitor.

5. A detection device that detects a state of a lithium-ion secondary battery, the detection device comprising:

a detector having at least one resonator circuit that applies at least one specific frequency vibration to the lithium-ion secondary battery, the detector measuring an attenuation characteristic of at least one resonant current and outputting the attenuation characteristic as a detection signal; and a controller that detects lithium deposition and/or presence of foreign metal inside the lithium-ion secondary battery by using the detection signal output from the detector, wherein the controller includes a logic calculator that has at least one sample-and-hold circuit and that calculates the detection signal output from a filter in the detector, an isolator that has a series capacitor and that outputs a drive signal to a drive circuit, and a main calculator that outputs a drive signal to the isolator and that receives the detection signal from the logic calculator.

6. The detection device according to claim 1, wherein the controller detects the lithium deposition and/or the presence of the foreign metal inside the lithium-ion secondary battery based on a decrease in a real part of impedance when the frequency vibration applied by the resonator circuit is in a range of 5 MHz or lower.

7. The detection device according to claim 1, wherein the controller detects a coating formed on an electrode based on an increase in a real part of impedance when the frequency vibration applied by the resonator circuit is in a range of 10 MHz or higher.

8. The detection device according to claim 1, wherein the lithium-ion secondary battery includes a plurality of parallel-connected or series-connected single cells connected to the detector, and wherein the controller is connected to a plurality of the detectors and detects the lithium deposition and/or the presence of the foreign metal inside any one of the single cells.

9. The detection device according to claim 1, wherein the detector has identification information for identifying the connected lithium-ion secondary battery and outputs the detection signal and the identification information in correspondence with each other.

10. The detection device according to claim 1, wherein the lithium-ion secondary battery is series-connected to an irreversible switch, and wherein, when the controller determines that the lithium-ion secondary battery is in an abnormal state, the controller turns off the irreversible switch.

11. A management apparatus that manages the lithium-ion secondary battery based on information acquired from the detection device according to claim 1, the management apparatus comprising:

a management unit that uses a detection result, output from the controller, about the lithium deposition inside the lithium-ion secondary battery to utilize the lithium-ion secondary battery while limiting usage thereof based on a remaining volume of active lithium.

12. A management apparatus that manages the lithium-ion secondary battery based on information acquired from the detection device according to claim 1, the management apparatus comprising:

a management unit that uses a detection result, output from the controller, about the lithium deposition inside the lithium-ion secondary battery to quantify a residual value, including a remaining usage time, of the lithium-ion secondary battery based on a remaining volume of active lithium.

13. A management apparatus that manages the lithium-ion secondary battery based on information acquired from the detection device according to claim 1, the management apparatus comprising:

a management unit that calculates a distribution value by using a detection result, output from the controller, about the lithium deposition inside the lithium-ion secondary battery, and outputs the calculated distribution value.

14. The detection device according to claim 1, wherein the detector includes the at least one resonator circuit, a wave sensor that rectifies a signal output from the at least one resonator circuit and outputs the signal as the detection signal, and the drive circuit that drives the at least one resonator circuit.

15. The detection device according to claim 14, wherein the detector includes a closed circuit, the wave sensor, and the drive circuit, the closed circuit being constituted of the at least one resonator circuit including a pickup-coil-equipped first inductor parallel-connected to the lithium-ion secondary battery, a resonant capacitor series-connected to the first inductor, and a semiconductor switch series-connected to the first inductor, the wave sensor having a pickup-coil-equipped second inductor that detects a resonant current flowing through the first inductor, a rectifier circuit constituted of a diode bridge connected to the second inductor, and a filter that includes a capacitor and a resistor, filters a rectified waveform, and outputs the detection signal, the drive circuit turning on the semiconductor switch via a drive capacitor parallel-connected to the lithium-ion secondary battery and via a buffer supplied with electric power from the drive capacitor.

16. The detection device according to claim 1, wherein the controller includes a logic calculator that has at least one sample-and-hold circuit and that calculates the detection signal output from a filter in the detector, an isolator that has a series capacitor and that outputs a drive signal to the drive circuit, and a main calculator that outputs a drive signal to the isolator and that receives the detection signal from the logic calculator.

17. A detection method for detecting a state of a lithium-ion secondary battery, the detection method comprising:

an output step for applying at least one specific frequency vibration to the lithium-ion secondary battery by at least one resonator circuit, measuring an attenuation characteristic of at least one resonant current of the at least one resonator circuit driven by a drive circuit while one end of the at least one resonator circuit is connected to one pole of the lithium-ion secondary battery and another end of the at least one resonator circuit is connected to another pole of the lithium-ion secondary battery, and outputting the measured attenuation characteristic as a detection signal; and a detection step for detecting lithium deposition and/or presence of foreign metal inside the lithium-ion secondary battery by using the detection signal outputted in the output step.

18. The detection method according to claim 17, wherein the detector includes the at least one resonator circuit, a wave sensor that rectifies a signal output from the at least one resonator circuit and outputs the signal as the detection signal, and the drive circuit that drives the at least one resonator circuit.

19. The detection method according to claim 18, wherein the detector includes a closed circuit, the wave sensor, and the drive circuit, the closed circuit being constituted of the at least one resonator circuit including a pickup-coil-equipped first inductor parallel-connected to the lithium-ion secondary battery, a resonant capacitor series-connected to the first inductor, and a semiconductor switch series-connected to the first inductor, the wave sensor having a pickup-coil-equipped second inductor that detects a resonant current flowing through the first inductor, a rectifier circuit constituted of a diode bridge connected to the second inductor, and a filter that includes a capacitor and a resistor, filters a rectified waveform, and outputs the detection signal, the drive circuit turning on the semiconductor switch via a drive capacitor parallel-connected to the lithium-ion secondary battery and via a buffer supplied with electric power from the drive capacitor.

20. The detection method according to claim 17, wherein the detection step is performed by a controller that includes: a logic calculator that has at least one sample-and-hold circuit and that calculates the detection signal output from a filter in the detector, an isolator that has a series capacitor and that outputs a drive signal to the drive circuit, and a main calculator that outputs a drive signal to the isolator and that receives the detection signal from the logic calculator.

\* \* \* \* \*